(12) United States Patent
Okushima et al.

(10) Patent No.: US 9,573,319 B2
(45) Date of Patent: Feb. 21, 2017

(54) IMPRINTING METHOD AND PROCESS FOR PRODUCING A MEMBER IN WHICH A MOLD CONTACTS A PATTERN FORMING LAYER

(75) Inventors: Shingo Okushima, Tokyo (JP); Nobuhito Suehira, Kawasaki (JP); Junichi Seki, Yokohama (JP); Kazuyuki Kasumi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 485 days.

(21) Appl. No.: 12/088,340

(22) PCT Filed: Feb. 5, 2008

(86) PCT No.: PCT/JP2008/052219
§ 371 (c)(1),
(2), (4) Date: Mar. 27, 2008

(87) PCT Pub. No.: WO2008/099795
PCT Pub. Date: Aug. 21, 2008

(65) Prior Publication Data
US 2010/0270705 A1 Oct. 28, 2010

(30) Foreign Application Priority Data

Feb. 6, 2007 (JP) .................. 2007-027168
Feb. 28, 2007 (JP) .................. 2007-050545

(51) Int. Cl.
*B29C 59/02* (2006.01)
*B29C 59/00* (2006.01)
(Continued)

(52) U.S. Cl.
CPC .............. *B29C 59/002* (2013.01); *B82Y 10/00* (2013.01); *B82Y 40/00* (2013.01); *G03F 7/0002* (2013.01); *G03F 9/703* (2013.01)

(58) Field of Classification Search
CPC ...................................................... G03F 9/7042
(Continued)

(56) References Cited

U.S. PATENT DOCUMENTS 5,726,879 A * 3/1998 Sato ................................ 700/56
5,959,304 A 9/1999 Tokita et al. .............. 250/492.2
(Continued)

FOREIGN PATENT DOCUMENTS

CN 1531668 A 9/2004
CN 1678956 A 10/2005
(Continued)

OTHER PUBLICATIONS

Stephen Y. Chou, et al., "Imprint of Sub-25 nm vias and trenches in Polymers," Applied Physics Letters, vol. 67, Issue 21, Nov. 20, 1995, pp. 3114-3116.
(Continued)

*Primary Examiner* — Ryan Ochylski
(74) *Attorney, Agent, or Firm* — Fitzpatrick, Cella, Harper & Scinto

(57) ABSTRACT

An imprinting method in which alignment control of a mold and a substrate is effected and a pattern formed on the mold is transferred onto a pattern forming layer provided on the substrate. The imprinting method includes a step in which the mold and the substrate are brought near to each other while effecting the alignment control, after the alignment control is started, to bring the mold and the pattern forming layer into contact with each other, and then, the pattern forming layer is cured, and a step in which the gap between the mold and the substrate is increased, after the pattern forming layer is cured. Further, the alignment control is stopped after the alignment control is started, and at least
(Continued)

one of before and after the mold contacts the pattern forming layer.

27 Claims, 19 Drawing Sheets

(51) Int. Cl.
    *B82Y 10/00*     (2011.01)
    *B82Y 40/00*     (2011.01)
    *G03F 7/00*     (2006.01)
    *G03F 9/00*     (2006.01)

(58) Field of Classification Search
    USPC ............................................... 264/40.1
    See application file for complete search history.

(56) References Cited

U.S. PATENT DOCUMENTS

| | | | |
|---|---|---|---|
| 6,696,220 | B2 | 2/2004 | Bailey et al. |
| 6,852,355 | B2 | 2/2005 | Blanchet-Fincher |
| 7,259,443 | B2 | 8/2007 | Blanchet-Fincher et al. |
| 7,391,090 | B2 | 6/2008 | Picciotto et al. ............ 257/415 |
| 7,711,281 | B2 | 5/2010 | Hamano et al. |
| 7,745,237 | B2 | 6/2010 | Katagiri et al. |
| 7,754,131 | B2 | 7/2010 | Olsson et al. |
| 7,794,222 | B2 | 9/2010 | Suehira et al. |
| 7,815,424 | B2 | 10/2010 | Nakamura et al. |
| 7,837,907 | B2 * | 11/2010 | Nimmakayala et al. ....... 264/39 |
| 2002/0093122 | A1* | 7/2002 | Choi et al. .................... 264/401 |
| 2002/0098426 | A1* | 7/2002 | Sreenivasan et al. .......... 430/22 |
| 2002/0115002 | A1* | 8/2002 | Bailey et al. ..................... 430/5 |
| 2002/0149315 | A1 | 10/2002 | Blanchet-Fincher |
| 2003/0035043 | A1* | 2/2003 | Sugiyama et al. ............ 347/171 |
| 2004/0219249 | A1* | 11/2004 | Chung et al. ................. 425/385 |
| 2005/0029934 | A1* | 2/2005 | Blanchet-Fincher ......... 313/504 |
| 2005/0064054 | A1 | 3/2005 | Kasumi |
| 2005/0082523 | A1 | 4/2005 | Blanchet-Fincher et al. |
| 2006/0131677 | A1* | 6/2006 | Picciotto et al. ............. 257/414 |
| 2006/0157444 | A1* | 7/2006 | Nakamura et al. ............. 216/54 |
| 2006/0170934 | A1 | 8/2006 | Picciotto et al. ............. 356/625 |
| 2006/0272535 | A1 | 12/2006 | Seki et al. .................... 101/492 |
| 2006/0273488 | A1 | 12/2006 | Seki et al. .................... 264/293 |
| 2006/0279004 | A1 | 12/2006 | Suehira et al. ................ 257/797 |
| 2006/0279022 | A1 | 12/2006 | Seki et al. .................... 264/293 |
| 2006/0286193 | A1 | 12/2006 | Ando et al. ................... 425/385 |
| 2007/0035056 | A1* | 2/2007 | Suehira et al. ............. 264/40.1 |
| 2007/0035731 | A1 | 2/2007 | Hülsmann et al. ........... 356/401 |
| 2007/0145639 | A1* | 6/2007 | Seki et al. .................... 264/293 |
| 2007/0146680 | A1 | 6/2007 | Inao et al. ...................... 355/75 |
| 2007/0172967 | A1 | 7/2007 | Katagiri et al. |
| 2007/0242272 | A1 | 10/2007 | Suehira et al. ............... 356/401 |
| 2007/0266875 | A1* | 11/2007 | Berge ........................... 101/481 |
| 2008/0042320 | A1 | 2/2008 | Seki et al. .................... 264/293 |
| 2008/0090160 | A1 | 4/2008 | Blackstock et al. ............ 430/30 |
| 2008/0090312 | A1* | 4/2008 | Park et al. ...................... 438/14 |
| 2008/0099941 | A1* | 5/2008 | Suehira et al. ............. 264/40.1 |
| 2010/0078854 | A1* | 4/2010 | Berggren et al. ............. 264/293 |
| 2010/0148397 | A1 | 6/2010 | Nakamura et al. |
| 2010/0314799 | A1 | 12/2010 | Suehira et al. |
| 2011/0272840 | A1 | 11/2011 | Suehira et al. |

FOREIGN PATENT DOCUMENTS

| | | |
|---|---|---|
| CN | 1876395 A | 12/2006 |
| CN | 101009218 A | 8/2007 |
| DE | 103 55 681 A1 | 7/2005 |
| EP | 1 243 438 A2 | 9/2002 |
| EP | 1 811 337 A2 | 7/2007 |
| JP | 9-039278 A | 2/1997 |
| JP | 2006-116602 A | 5/2006 |
| JP | 2006-165371 A | 6/2006 |
| JP | 2007-027168 A | 2/2007 |
| JP | 2007-050545 A | 3/2007 |
| KR | 10-2007-0010319 A | 1/2007 |
| TW | 228764 B1 * | 3/2005 |
| TW | 200522173 | 12/2012 |
| WO | WO 02/067055 A2 | 8/2002 |
| WO | 02/070271 A2 | 9/2002 |
| WO | WO 2006/001520 A1 | 1/2006 |
| WO | 2006/024908 A2 | 3/2006 |
| WO | WO 2006024908 A2 * | 3/2006 |
| WO | WO 2008/048595 A2 | 4/2008 |

OTHER PUBLICATIONS

Written Opinion of the International Searching Authority mailed Dec. 1, 2008, issued in corresponding International Application No. PCT/JP2008/052219.

International Search Report dated Nov. 19, 2008, which issued in corresponding International Application No. PCT/JP2008/052219.

Gao, Jun, et al. "From nanoscale displacement sensing and estimation to nanoscale alignment," *J. Vac. Sci. Technol.* B 24(6), Nov./Dec. 2006, pp. 3094-3100.

Chinese Official Action dated May 25, 2011, issued in corresponding Chinese patent application No. 200880003889.1, with a Japanese translation.

Communication pursuant to Article 94(3) EPC dated Jun. 10, 2011, issued in corresponding European patent application No. 08 711 085.4.

Korean Office Action dated Mar. 17, 2011, issued in counterpart Korean patent application No. 10-2009-7017945.

Communication pursuant to Article 94(3) EPC issued Apr. 11, 2011, in counterpart European patent application No. 08 711 085.4-2222.

English translation of Korean Office Action mailed Mar. 17, 2011, issued in counterpart Korean patent application No. 10-2009-7017945.

Brief Communication issued by the European Patent Office May 24, 2011, including Communication pursuant to Article 94(3) EPC.

Korean Notice of Allowance issued Nov. 28, 2012, in counterpart Korean Patent Application No. 10-2009-7017945.

Korean Official Action dated Mar. 22, 2012, issued in counterpart Korean patent application No. 10-2009-7017945.

Korean Notice of Allowance issued Mar. 27, 2013, in counterpart Korean Patent Application No. 10-2011-7021866.

English translation of Korean Office Action dated Mar. 22, 2012, issued in counterpart Korean patent application No. 10-2009-7017945.

Chinese Notice of Allowance or Notice of Acceptance mailed Oct. 8, 2012, in counterpart Chinese Patent Application No. 200880003889.1.

Chinese Office Action and Search Report dated May 9, 2013, issued in corresponding Chinese Patent Application No. 201110313093.X, with an English translation.

Chinese Office Action dated Jan. 27, 2014, issued in corresponding Chinese Patent Application No. 201110313093.X, with an English translation.

Chinese Notice of Allowance dated Feb. 4, 2015, issued in counterpart Chinese Patent Application No. 201210118450.1.

* cited by examiner

IMPRINTING METHOD AND PROCESS FOR PRODUCING A MEMBER IN WHICH A MOLD CONTACTS A PATTERN FORMING LAYER

This application is a U.S. national stage application of PCT International Application No. PCT/JP2008/052219, filed Feb. 5, 2008, which claims priority from Japanese Patent Application No. 2007-027168, filed Feb. 6, 2007, and No. 2007-050545, filed Feb. 28, 2007.

TECHNICAL FIELD

The present invention relates to an imprint method and an alignment apparatus.

BACKGROUND ART

In recent years, as described in, for example, Appl. Phys. Lett., Vol. 67, Issue 21, pages 3114-3116 (1995) by Stephan Y. Chou, et al., a fine processing technology for transferring a fine structure provided on a mold onto a member to be processed, such as a resin material, a metallic material, or the like, has been developed and has received attention. This technology is called nanoimprinting or nanoembossing, and provides a processing resolving power on the order of several nanometers. For this reason, the technology is expected to be applied to a next-generation semiconductor manufacturing technology in place of a light exposure device, such as a stepper, a scanner, or the like. Further, the technology is capable of effecting simultaneous processing of a three-dimensional structure at a wafer level. For this reason, the technology has been proposed to be applied to a wide variety of fields in manufacturing technologies, and the like, for optical devices, such as photonic crystals, and the like, biochips, such as a μ-TAS (micro total analysis system), etc.

In such a pattern transfer technology using nanoimprinting, e.g., when the technology is used in the semiconductor manufacturing technology, or the like, a minute (fine) structure at a mold surface is transferred onto a work (workpiece) in the following manner.

First, on a substrate (e.g., a semiconductor wafer), as the member to be processed constituting the work, a resin layer of a photocurable resin material is formed. Next, a mold, on which a minute structure having a desired projection/recess pattern is formed, is aligned with the work on an ultraviolet (UV) curable resin material, is filled between the mold and the substrate, followed by irradiation with ultraviolet rays to cure the UV curable resin material. As a result, the minute structure of the mold is transferred onto the resin layer. Then, etching, or the like, through the resin layer, as a mask, is effected to form the minute structure of the mold on the substrate.

Incidentally, in semiconductor manufacturing, it is necessary to effect (positional) alignment of the mold with the substrate. For example, in such a current circumstance that a semiconductor process rule is not more than 100 nm, a tolerance of an alignment error due to an apparatus is said to be several nanometers to several tens of nanometers.

As such an alignment method, e.g., U.S. Pat. No. 6,696,220 has disclosed a technique using different focal lengths with respect to two wavelength light beams, i.e., first and second light beams different in wavelength. In this technique, when a gap between a mold and a substrate has a specific value, a mark provided at a mold surface is formed as an image at a first wavelength on an image pickup device and a mark provided at a substrate surface is formed as an image at a second wavelength, on the same image pickup device. By observing the mold surface mark and the substrate surface mark, in-plane alignment between the mold and the substrate is effected.

Incidentally, with an increasing demand for high-definition fine processing these days, improvements in transfer accuracy and transfer speed by the above-described nanoimprinting are required.

The alignment method disclosed in U.S. Pat. No. 6,696,220, however, is not always satisfactory for such a demand. That is, the alignment method of U.S. Pat. No. 6,696,220 causes the following problem in the in-plane alignment using the mark of the mold and the mark of the substrate.

In the pattern transfer using the nanoimprinting, different from a transfer (exposure) method using a conventional light exposure device, it is necessary to transfer the minute structure provided on the mold in contact with the work (the member to be processed), as described above.

In such a process that the transfer is performed, a contact interface between the mold and the resin material can be placed in an unstable state in a transition period during the contact of the mold with the photocurable resin material of the work. Alternatively, before and after the mold and the photocurable resin material on the work contact each other, various physical conditions with respect to measurement and drive for the alignment can be changed.

The present inventors have come to a recognition that, with respect to a control condition limiting the alignment in the imprinting process, an occurrence of an inconvenience may arise when the control condition is invariant during a period from a non-contact state between the mold and the resin material to a resin material curing process through a contact stage between the mold and the resin material. For example, a case wherein in-plane alignment of a mold with a substrate is performed by observing a mold surface mark and a substrate surface mark is considered.

When alignment feedback control is effected under a control condition for the case of no error, although an error arises in a measurement unit obtained by the observation, an occurrence of a malfunction may arise as a result.

DISCLOSURE OF THE INVENTION

In view of the above-described problems, the present invention has improved a control condition with respect to alignment in an imprinting process.

Specific embodiments of the present invention will be described later, but an imprinting method according to a first aspect of the present invention is characterized in that feedback control is once stopped or interrupted during alignment using feedback control. An imprinting method according to a second aspect of the present invention is characterized in that a control condition with respect to alignment is changed during an imprinting process.

(First Aspect of the Present Invention)

The imprinting method according to the first aspect of the present invention will be specifically described.

According to a first aspect, the present invention provides an imprinting method for imprinting an imprinting pattern provided to a mold onto a pattern forming layer formed on a substrate, the imprinting method comprising:

a first step of effecting alignment between the substrate and the mold with feedback control;

a second step of bringing the mold and the pattern forming layer into contact with each other;

a third step of curing the pattern forming layer; and a fourth step of increasing a gap between the substrate and the mold, wherein the imprinting method further comprises a step of stopping the feedback control between the first step and the second step and/or between the second step and the third step.

The present invention provides imprinting methods, imprinting apparatuses, and an alignment method constituted as described below.

The present invention provides an imprinting method for imprinting a pattern provided to a mold onto a resin material applied onto a substrate by effecting alignment between the mold and the substrate with feedback control, wherein the imprinting method comprises a step of performing feedback control, so that a malfunction of the feedback control, occurring during contact between the mold and the resin material when the imprinting is performed, by bringing the mold and the resin material into contact with each other, is reduced or overcome.

In the imprinting method of the present invention, an operation in the step of performing the feedback control may be a stopping operation of the feedback control when the contact between the mold and the resin material is detected. The operation in the step of performing the feedback control may also be a stopping operation of the feedback control when the mold and the resin material are placed in predetermined positions in front of the contact position therebetween.

In the imprinting method of the present invention, after the feedback control is stopped, the feedback control for alignment may be resumed. Further, after the feedback control is stopped and before the feedback control is resumed, adjustment of a gap between opposing surfaces of the mold and the substrate may be performed.

In the imprinting method of the present invention, the operation in the step of performing the feedback control may be a starting operation of the feedback control when the contact between the mold and the resin material is detected. Further, the operation in the step of performing the feedback control may be a feedback control operation performed by changing an original control parameter in the feedback control when the resin material is brought into contact with the mold. The change in the control parameter may be made after the feedback control is stopped when the contact between the mold and the resin material is detected. The change in the control parameter may be made when the contact between the mold and the resin material is detected after the feedback control is stopped, when the mold and the resin material are placed in predetermined positions in front of the contact position therebetween.

In the imprinting method of the present invention, adjustment of a gap between opposing surfaces of the mold and the substrate may be performed after the feedback control is stopped and before the control parameter is changed.

In the imprinting method of the present invention, the control parameter may be any of a position measurement parameter for effecting alignment with respect to an in-plane direction, a distance measurement parameter for effecting distance adjustment between the mold and the substrate, and a drive control parameter for performing an alignment operation between the mold and the substrate.

In the imprinting method of the present invention, the detection of the contact between the mold and the resin material may be performed by a change in gradation of an observation image in the feedback control. The detection of the contact between the mold and the resin material may be performed by a change in pressure exerted on the mold or the substrate in the feedback control. Further, the detection of the contact between the mold and the resin material may be performed by a change in a measurement result of a distance between the mold and the substrate in the feedback control.

In the present invention, an imprinting apparatus for imprinting a pattern provided at a processing surface of a mold onto a resin material applied onto a substrate comprises a contact detection means for detecting contact between the mold and the resin material and a process control means for causing a position control means to effect alignment between the mold and the substrate, so that a malfunction does not occur during the contact between the mold and the resin material. The process control means may be a control means for stopping the feedback control when the contact between the mold and the resin material is detected by the contact detection means. The process control means may be a control means for stopping the feedback control when the mold and the resin material are placed in predetermined positions in front of their contact position. The process control means may be a control means for resuming the feedback control for alignment after the feedback control is stopped. The process control means may be a control means for controlling a gap between opposing surfaces of the mold and the substrate after the feedback control is stopped and before the feedback control is resumed. The process control means may be a control means for starting the feedback control when the contact between the mold and the resin material is detected by the contact detection means. The process control means may be a control means for effecting the feedback control by changing an original control parameter in the feedback control when the contact between the mold and the resin material is detected by the contact detection means. The process control means may be a means for effecting control so that the control parameter is changed when the contact between the mold and the resin material is detected after the feedback control is stopped when the mold and the resin material are placed in predetermined positions in front of their contact position. The process control means may be a control means for resuming the feedback control for alignment after the control parameter is changed. The process control means may be a control means for effecting control of a gap between opposing surfaces of the mold and the substrate after the feedback control is stopped and before the control parameter is changed.

In the present invention, an alignment method of two members includes oppositely disposing a first member and a second member contacting a fluid material, effecting alignment between the first member and the second member with feedback control, and stopping the feedback control or changing a control condition in the feedback control, by utilizing information about contact between the first member and the fluid material.

(Second Aspect of the Present Invention)

According to a second aspect, the present invention provides an imprinting method for transferring an imprinting pattern provided to a mold onto a pattern forming layer interposed between the mold and a substrate, the imprinting method comprising:

a detecting step of detecting states of the mold and the pattern forming layer, during the transfer of the imprint pattern, by at least one of a displacement of the mold or the substrate, a torque of a stage, and an amount of reflected light from the mold or the substrate; and a changing step of changing at least one of a control method, a driving profile, and a control parameter of the stage on the basis of a detected value in the detecting step.

The present invention provides imprinting apparatuses and imprinting methods constituted as described below.

The present invention provides an imprinting apparatus for transferring a pattern of a mold onto a resin material interposed between the mold and substrate. The imprinting apparatus comprises a stage for positioning one of the mold and the substrate with respect to the other, a control portion for controlling the stage, a detection means for detecting states of the mold and the resin material in the pattern transfer by at least one of a load exerted on the mold or the substrate, a gap between the mold and the substrate, a displacement of the mold or the substrate, a torque of the stage, and an amount of reflected light from the mold or the substrate, and a means for changing at least one of a stage control method, a stage drive profile, and a stage control parameter on the basis of a detection value detected by the detection means.

In the imprinting apparatus of the present invention, the detection means may be a means for detecting states of the mold and the resin material with a change in gap between the mold and the substrate or stages of the mold and the resin material with a change in gap between the mold and the substrate until the gap is controlled at a constant level and is placed in a steady state.

In the imprinting apparatus of the present invention, the detection value may include a change in differential coefficient and a change in second-order differential coefficient. The change in differential coefficient or the change in second-order differential coefficient may be a change in sign thereof. The detection means is capable of detecting a state due to an attraction force exerted between the mold and the resin material as the states of the mold and the resin material.

In the imprinting apparatus of the present invention, the control method may be either one or both of feedback control and feedforward control. The drive profile may include any of an acceleration, a speed, a position, a driving voltage, and a driving current with respect to the stage. The control parameter may include any of a PID parameter, a feedfoward parameter, and a filter parameter.

The present invention provides an imprinting method for transferring a pattern of a mold onto a resin material interposed between the mold and a substrate. The imprinting method comprises a detecting step of detecting stages of the mold and the resin material in the pattern transfer by at least one of a load exerted on the mold or the substrate, a gap between the mold and the substrate, a displacement of the mold or the substrate, a torque of a stage, and an amount of reflected light from the mold or the substrate, and a changing step of changing at least one of a stage control method, a stage drive profile, and a control parameter on the basis of a detection value detected in the detecting step.

In the imprinting method of the present invention, the detection value may include a change in differential coefficient and a change in second-order differential coefficient. The change in differential coefficient or the change in second-order differential coefficient may be a change in sign thereof. The detection states of the mold and the resin material result from an attraction force exerted between the mold the resin material.

In the imprinting method of the present invention, at least one of the control method, the drive profile, and the control parameter may be changed before and/or after the mold and the resin material is cured. In the imprinting method, with respect to each of axes in an in-plane direction of the mold, either one or both of different control methods and different control parameters may be changed.

The present invention provides an imprinting method comprising a gap decreasing step of decreasing a gap between a mold and a substrate in a state in which a resin material is interposed between the mold and the substrate, and a step of curing the resin material and transferring a pattern provided to the mold onto the resin material after the gap decreasing step. In the gap decreasing step, while detecting a load including a pressure exerted between the mold and the substrate on a time base, a control condition concerning movement of the mold and the substrate in a direction perpendicular to their opposing surfaces is changed between a state in which the load is increased with the decreasing gap and a stage in which the load is decreased with the decreasing gap.

According to the present invention, it is possible to effect alignment control more suitable for an imprinting process.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 14(a), 14(b) and 14(c) are schematic diagrams illustrating control of a stage in Embodiment 2-1 of the present invention, wherein FIG. 14(a) is a control block diagram, FIG. 14(b) is a diagram for illustrating a PI control mechanism, and FIG. 14(c) is a diagram showing a time chart.

FIGS. 16(a) and 16(b) are schematic diagrams illustrating a problem to be solved by the present invention, wherein FIG. 16(a) is a control block diagram and FIG. 16(b) is a time chart.

FIGS. 20(a), 20(b) and 20(c) are schematic diagrams illustrating control of a stage in Embodiment 2-3 of the present invention, wherein FIG. 20(a) is a control block diagram, FIG. 20(b) is a diagram for illustrating a PI control mechanism, and FIG. 20(c) is a time chart.

BEST MODE FOR CARRYING OUT THE INVENTION

The present invention is an imprinting method for imprinting a pattern provided to a mold onto a pattern forming layer formed on a substrate.

Specifically, the imprinting method includes the following first to fourth steps:

first step: alignment between the substrate and the mold is effected while effecting alignment control, second step: the mold and the pattern forming layer are brought into contact with each other, third step: the pattern forming layer is cured, and fourth step: a gap between the substrate and the mold is increased.

In the second step, the contact between the mold and the pattern forming layer means not only direct contact between the mold and the pattern forming layer, but also, indirect contact therebetween through a release layer. In the latter case, the release layer can be inclusively regarded as the mold.

In the third step, the curing of the pattern forming layer may be performed by using light, such as ultraviolet rays, or using heat.

The operation performed in the fourth step is a so-called releasing operation.

In the present invention, in order to prevent a malfunction of the alignment control occurring during the contact between the mold and the substrate, the imprinting method further includes another step.

Specifically, between the first step and the second step and/or between the second step and the third step, the imprinting method includes the following step (A) or (B):

(A) a step of stopping the feedback control, or (B) a step of changing at least one of a control method, a drive profile, and a control parameter of a stage for effecting the alignment control.

Hereafter, two embodiments including the step (A) and the step (B) as features thereof, respectively, will be described as a First Embodiment and a Second Embodiment.

First Embodiment

Imprinting Process (Method) and Imprinting Apparatus Including Feedback Control Step In an imprinting method of this embodiment, an imprinting pattern provided to a mold is imprinted on a pattern forming layer formed on a substrate.

Figure 1:
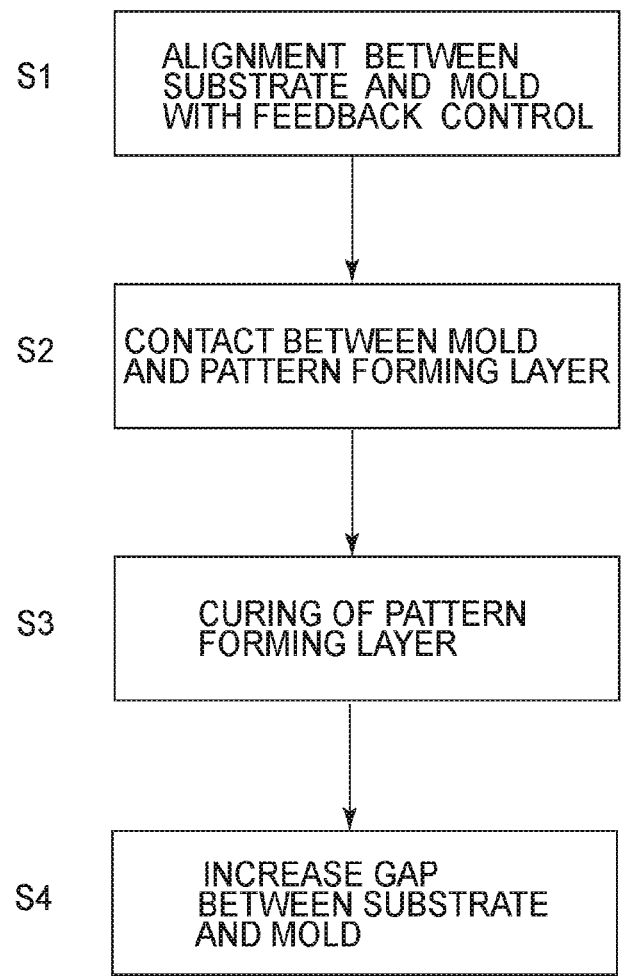
FIG. 1 is a flow chart illustrating an imprinting process according to the present invention.

Specifically, as shown in FIG. 1, the imprinting method includes the following first to fourth steps (a) to (d):

(a) first step: alignment between the substrate and the mold is effected while effecting feedback control (S1), (b) second step: the mold and the pattern forming layer are brought into contact with each other (S2), (c) third step: the pattern forming layer is cured (S3), and (d) fourth step: a gap between the substrate and the mold is increased (S4).

In the imprinting method, between the first step and the second step and/or between the second step and the third step, the feedback control is stopped.

In the case wherein the feedback control is stopped between the first step and the second step, after the feedback control is stopped, the mold and the pattern forming layer contact each other. Accordingly, in the case wherein an error in position measurement information occurs during the contact between the mold and the pattern forming layer, the feedback control is not carried out, so that it is possible to prevent a malfunction with respect to an alignment control operation. Incidentally, the feedback control and an imprinting apparatus for performing the imprinting process will be specifically described later with reference to FIG. 3 and FIG. 2, respectively.

In a state in which the feedback control is stopped after the alignment between the substrate and the mold is effected in the first step described above, the second step is performed and, thereafter, the alignment between the substrate and the mold can be effected with the feedback control (as specifically described later with reference to FIG. 8).

Further, in a state in which the feedback control is stopped after the alignment is effected in the first step, the second step is performed and, thereafter, it is also possible to perform the alignment of the substrate and the mold with feedback control on the basis of a control parameter different from that of the feedback control in the first step (as specifically described later with reference to FIG. 12).

Incidentally, after positional control, such as the feedback control, is once stopped, it is also possible to effect control on the basis of a measurement parameter different from that of the feedback control in the first step, in place of the control parameter different from that of the feedback control in the first step. The measurement parameter may include a refractive index for calculating a distance and a threshold of a gradation (level) value for detecting a position.

In a case wherein the feedback control is stopped between the second step and the third step, it is possible to prevent the malfunction, similarly, as in the above-described case, e.g., by stopping the feedback control immediately after the detection of the contact between the mold and the pattern forming layer.

In a state in which the feedback control is stopped after the mold and the pattern forming layer are brought into contact with each other in the second step, the gap between the substrate and the mold is decreased and, thereafter, it is possible to effect alignment between the substrate and the mold with feedback control (as specifically described later with reference to FIG. 4).

Further, in a state in which the feedback control is stopped after the mold and the pattern forming layer are brought into contact with each other in the second step, the gap between the substrate and the mold is decreased and, thereafter, it is also possible to effect alignment between the substrate and the mold with feedback control on the basis of a control parameter different from that of the feedback control in the first step (as specifically described later with reference to FIG. 9).

Herein, the term "feedback control" means control with respect to so-called alignment for determining a relative positional relationship between the mold and the substrate. Further, the term "alignment" means positional adjustment with respect to a positional relationship between the mold and the substrate in an in-plane direction or positional adjustment with respect to a gap between the mold and the substrate. With respect to these alignments (positional adjustments), it is possible to effect the feedback control.

In this embodiment, in place of the feedback control, it is also possible to employ another alignment control, such as feedforward control.

In the above-described second step, it is possible to appropriately detect the contact between the mold and the pattern forming layer.

The substrate may include, e.g., quartz, glass, a silicon wafer, and the like, but it is not particularly limited.

The pattern forming layer may, e.g., comprise a photo-curable resin material. The present invention provides a process suitable for a so-called photoimprinting, but may also be applicable to thermal imprinting using a thermoplastic resin material.

The mold is provided with an imprinting pattern having a projection/recess structure. The mold is, e.g., formed of quartz. In some cases, on the surface of the mold, a layer of fluorine-containing resin material as a release agent is applied. In the present invention, in a case wherein such a release agent is used, the release agent is inclusively regarded as being the mold. Accordingly, the second step includes not only the case of direct contact between the mold and the pattern forming layer, but also, the case of contact therebetween through the release agent.

The curing of the pattern forming layer in the third step is performed by, e.g., ultraviolet irradiation, or the like. Also, during the curing of the pattern forming layer, it is preferable that the position control between the mold and the substrate is effected (in this case, the position control is not limited to the feedback control, but may also be either one or both of in-plane position control and gap control).

In the fourth step, the cured pattern forming layer and the mold are separated from each other by increasing the gap between the substrate and the mold. In the fourth step, it is possible to appropriately determine an object to be moved from either one or both of the substrate and the mold.

The present invention is also applicable to a method for forming an imprinting pattern on an entire large-size substrate by performing a plurality of imprinting process operations with a mold smaller than the substrate (step-and-repeat method).

An imprinting apparatus in this embodiment includes, as a means for executing the above-described imprinting process, the following portions:

a mold holding portion for holding a mold;
a substrate holding portion for holding a substrate;
a position control portion for controlling a positional relationship, with feedback control, between held by the mold holding portion and the substrate held by the substrate holding portion; and
a contact detecting portion for detecting contact between a pattern forming layer on the substrate and the mold.

In the imprinting apparatus of this embodiment, after the feedback control by the position control portion is stopped, the mold holding portion and the substrate holding portion are relatively moved so as to bring the pattern forming layer and the mold into contact with each other. Alternatively, after the control between the pattern forming layer and the mold is detected by the contact detection portion, the feedback control is stopped.

By using the above-described imprinting method, it is possible to provide a member having a desired pattern shape. Specifically, a substrate subjected to the above-described imprinting process is prepared and subjected to etching through, as a mask, a pattern forming layer onto which the imprinting pattern described above is transferred. In this way, the substrate is processed to obtain a member having the desired pattern shape. Examples of the member may include a biochip provided with minute flow passages and a semiconductor chip.

In this embodiment, it is also possible to know information about the contact by an operation time of the imprinting apparatus without providing the above-described contact detecting portion. For example, information about a distance between the mold and the substrate, a thickness of the resin material (pattern forming layer), and a gap between the mold and the substrate is collected at the time of starting the imprinting operation. When a speed during an increase in gap can be known, it is possible to know whether or not the mold contacts the resin material at a certain time.

Accordingly, the imprinting apparatus can also be constituted by including the mold holding portion, the substrate holding portion and the position control portion, wherein the mold holding portion and the substrate holding portion are relatively moved, so that the pattern forming layer and the mold contact each other after the feedback control by the position control is stopped, or wherein the position control is stopped after the pattern forming layer and the mold contact each other.

Second Embodiment

An imprinting method of this embodiment will be described below.

First, a problem arising during alignment between the mold and the substrate will be described.

Figure 16A:
Figure 16B:
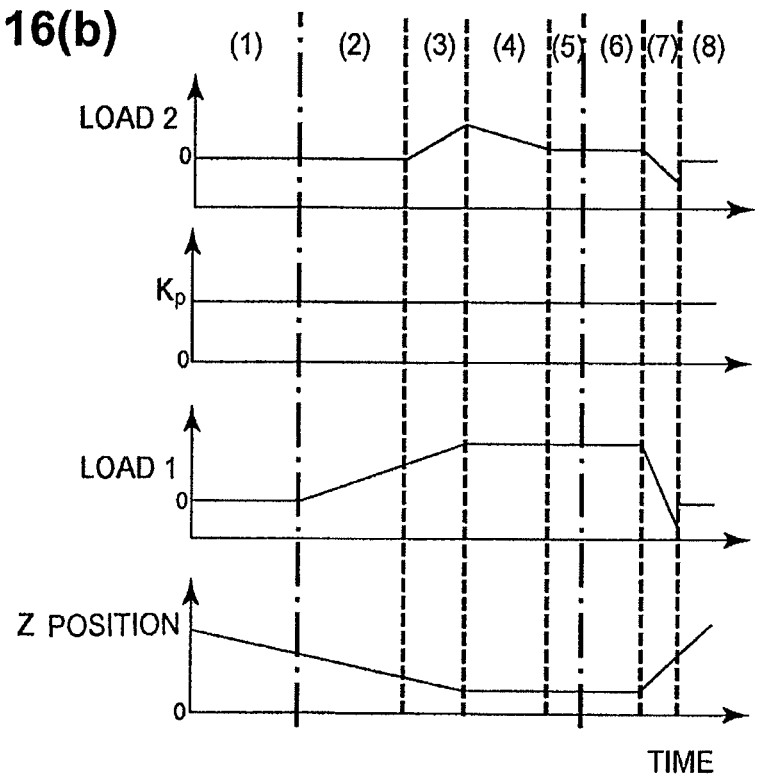

FIGS. 16($a$) and 16($b$) are schematic diagrams for illustrating an imprinting state.

FIG. 16($a$) is a block diagram. As shown in FIG. 16($a$), a signal from a profiler is inputted into a control mechanism and an output from the control mechanism is inputted into an object to be controlled. FIG. 16($b$) is a time chart, wherein a z-position profile, during imprinting, in which the substrate is brought near to the mold and the resin material contacts the mold and is UV-cured and released from the mold, is shown. A point z=0 is a position at which the mold and the substrate completely contact each other. Because of the presence of the resin material, in this profile, the movement is stopped at a position where z is, e.g., 100 nm. In FIG. 16($b$), (1) is an area in which the mold and the resin material on the substrate do not contact each other; (2) to (5) are areas in which the mold and the (liquid) resin material contact each other; (6) is an area in which the resin material is cured by UV irradiation; (7) is an area in which the mold is separated from the resin material; and (8) is an area in which the mold is retracted from the contact position.

Herein, for reference, a load exerted on the mold during a conventional imprinting process is taken as load 1. In this case, the resin material has a high viscosity, so that a repulsive force is exerted depending on a z-position from the area (2) in which the mold contacts the resin material. A control parameter of a stage is constant at a proportional component Kp. However, in semiconductor manufacturing processing these days, a process rule is small, so that a gap between the mold and substrate is decreased to several tens of nanometers. For this reason, such an attempt to utilize a low-viscosity resin material to lower a pressing force has been made.

In these circumstances, when the load is measured in detail, it has been found that a phenomenon such as a load 2 is caused to occur.

Specifically, when the load in the state in which the mold contacts the resin material, there arise the three cases (1), (2) and (3):

(1) the case in which the load is not so changed even when the mold and the resin material contact each other, (2) the case in which a repulsive force is exerted between the mold and the substrate, and (3) the case in which an attractive force is exerted between the mold and the substrate.

The load is not changed with not only the change in gap between the mold and the substrate, but also, a time until the gap is controlled at a constant level to be placed in a steady state. The load is changed depending on not only a component, a viscosity, a thickness, a density, a contact area, and the like, with respect to the resin material, but also, a surface state of the mold, a pattern shape, and the like. For this reason, in the case wherein the mold and the substrate are controlled by the same control parameter, an increase in positional error and an increase in setting time are caused to occur. Further, the control is unstable in some cases, and the pattern of the mold or the substrate can be broken occasionally.

In this embodiment, in view of the above-described problems, imprinting apparatuses and methods are provided that are capable of improving the accuracy of alignment between the mold and the substrate by changing at least one of control conditions concerning the mold and the substrate, depending on states of the mold and the resin material, which vary depending on the change in gap between the mold and the substrate in the pattern transfer.

More specifically, by changing at least one of control conditions, such as a stage control method, a stage drive profile, and a stage control parameter, depending on the state of the resin material interposed between the mold and the substrate, adverse effects due to the change in load exerted between the mold and the substrate are obviated.

For this reason, in this embodiment, the imprinting method and the imprinting apparatus can be constituted specifically as follows.

In the second embodiment, an imprinting method for transferring an imprinting pattern provided to a mold onto a pattern forming layer interposed between the mold and a substrate is characterized by including a detecting step of detecting states of the mold and a detecting step of detecting states of the mold and the pattern forming layer during the imprinting pattern transfer by at least one of a load exerted on the mold or the substrate, a gap between the mold and the substrate, a displacement of the mold or the substrate, a torque of the stage, and an amount of reflected light from the mold or the substrate, and a step of changing at least one of a stage control method, a stage drive profile and a stage control parameter on the basis of a detection value detected in the detecting step.

It is also possible to add, to the above steps, the following steps:

a position control step for performing control of alignment between the mold and the substrate, a contact step for bringing the mold and the pattern forming layer into contact with each other, a curing step for curing the pattern forming layer, a step of increasing the gap between the mold and the substrate, and a step of stopping the alignment control in the position control step between the position control step and the contact step and/or between the contact step and the curing step.

An imprinting apparatus for carrying out the above-described imprinting method is used for transferring a pattern of the mold onto the resin material interposed between the mold and the substrate and includes:

a stage for positioning one of the mold and the substrate with respect to each other, a control portion for controlling the stage, a detecting means for detecting states of the mold and the resin material by at least one of a load exerted on the mold or the substrate, a gap between the mold and the substrate, a displacement of the mold or the substrate, a torque of the stage, and an amount of reflected light from the mold or the substrate, and a means for changing at least one of a stage control method, a stage drive profile, and a stage control parameter on the basis of a detection value detected by the detecting means.

As the control method, it is possible to employ either one or both of the feedback control and forward control.

By the above-described constitution, depending on the states of the mold and the resin material, particularly, depending on a state of the resin material varying due to a change, in load exerted between the mold and the substrate, from the repulsive force to the attractive force, by changing at least one of the control conditions described above, the above-described adverse effects are obviated.

Further, in this embodiment, the imprinting method can be specifically constituted as follows.

The states of the mold and the resin material in the pattern transfer are detected by at least one of the load exerted on the mold or the substrate, the gap between the mold and the substrate, the displacement of the mold or the substrate, the stage torque, and the amount of reflected light from the mold or the substrate. In this case, it is possible to employ a constitution in which states of the mold and the resin material, with a change in gap between the mold and the substrate, or states of the mold and the resin material with such a change, that the gap between the mold and the substrate is controlled at a constant level until the gap is placed in steady state, are detected. Then, on the basis of a detected value, at least one of the stage control method, the stage drive profile, and the stage control parameter is changed.

Further, by the above-described constitution, depending on the states of the mold and the resin material, particularly, depending on a state of the resin material varying due to a change, in a load exerted between the mold and the substrate, from the repulsive force to the attractive force, by changing at least one of the control conditions described above, the above-described adverse effects are obviated.

The imprinting method of this embodiment is constituted by including a step of decreasing the gap between the mold and the substrate in a state in which the resin material is interposed between the mold and the substrate, and a step of curing the resin material and transferring the pattern provided to the mold onto the resin material after the step of decreasing the gap. Further, in the gap decreasing step, while detecting a load including a pressure exerted between the mold and the substrate on a time basis, a control condition, concerning movement of the mold and the substrate in a direction perpendicular to opposing surfaces of the mold and the substrate, is changed between a state in which the load is increased with the decreasing gap and a state in which the load is decreased with the decreasing gap.

By the constitution described above, an occurrence of breakage, or the like, due to contact between the mold and the substrate at the instant at which the load exerted between the mold and the substrate, is changed from the repulsive force to the attractive force, while the gap between the mold and the substrate is decreased, is obviated.

Hereafter, embodiments of the present invention will be described specifically.

Embodiment 1-1

An imprinting apparatus and an imprinting method according to the present invention will be described.

Figure 2:
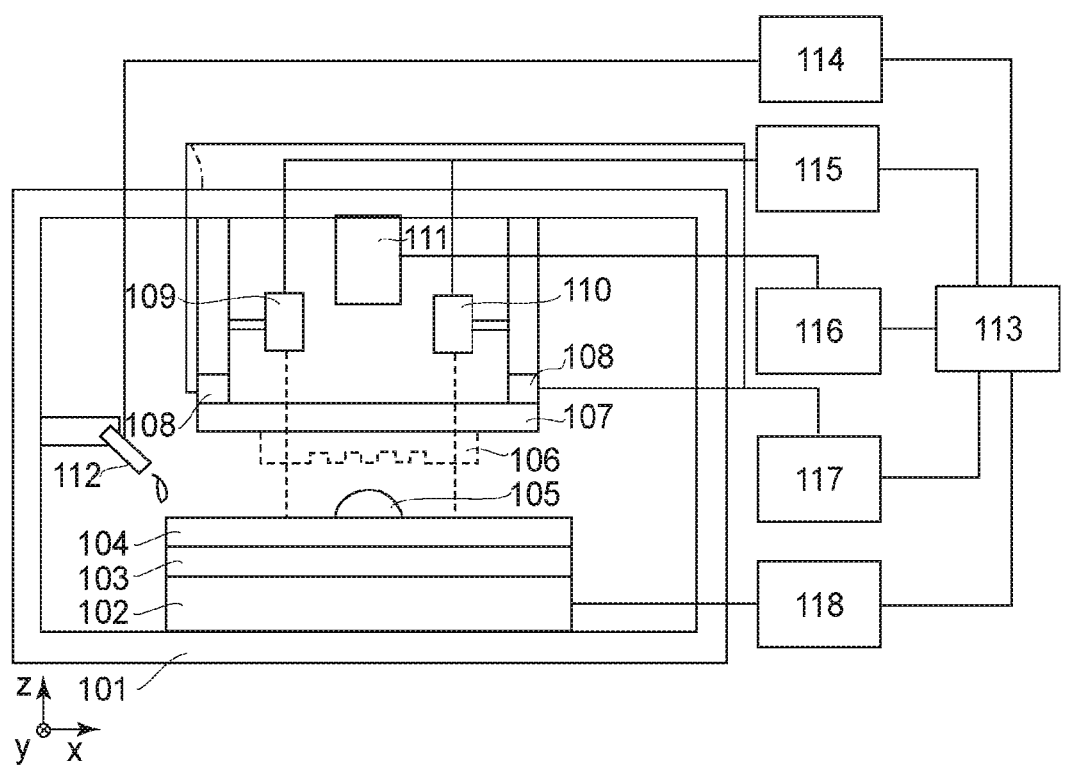
FIG. 2 is a schematic diagram illustrating a constitution of an imprinting apparatus in Embodiment 1-1 of the present invention.

FIG. 2 is a schematic view for illustrating a constitution of the imprinting apparatus of this embodiment.

Referring to FIG. 2, the imprinting apparatus includes a casing 101, a stage 102, a substrate holding portion 103, a substrate 104, a photocurable resin material 105, a mold 106 having a pattern at its processing surface, a mold holding portion 107, a load cell 108, scopes 109 and 110, a UV light source 111, a dispenser 112, a process control circuit (means) 113, an application control circuit 114, a position detection circuit (means) 115, an exposure amount control circuit 116, a pressure detection circuit 117, and a position control circuit (means) 118.

As shown in FIG. 2, in the imprinting apparatus of this embodiment, the mold 106 and the substrate 104, are disposed opposite to each other.

The mold 106 is a transparent member having a desired projection/recess (uneven) pattern at its surface facing the substrate 104 and is connected to the casing 101 through the mold holding portion 107, the load cell 108, and a member. A material for the mold 106 can be appropriately selected from transparent materials such as quartz, sapphire, $TiO_2$, SiN, and the like. At the substrate-side surface of the mold 106, a releasing treatment using a fluorine-containing silane coupling agent, or the like, may generally be performed.

The scope 109 is constituted by a light source, a lens system and an image-pickup device, and obtains information between the mold 106 and the substrate 104 as an image. The scope 110 is constituted by a light source, a lens system and an image-pickup device, and obtains an interference spectrum obtained from a gap between the opposing surfaces of the mold 106 and the substrate 104.

The UV light source 11 is provided at a portion of the casing 101 facing the back-side surface of the mold 106.

The substrate 104 is mounted on the stage 102 through the substrate holding portion 103.

The stage 102 has six movable directions with respect to six axes (x, y, z, θ, α, β), and is secured to the casing 101.

The dispenser 112 is attached to the casing 101 through a member, so that the photocurable resin material 105 can be applied onto the substrate at any position.

The process control circuit (means) 113 provides instructions to the application control circuit 114, the position detection circuit (means) 115, the exposure amount control circuit 116, the pressure detection circuit 117, and the position control circuit (means) 118, to carry out the imprinting process. Further, at the same time, the process control circuit 113 receives output data from these circuits to control the entire process.

The application control circuit 114 controls the dispenser 112 so as to apply the photocurable resin material 105 onto the substrate 104.

The position detection circuit 115 performs image processing of the image obtained by the scope 109 and analysis of a waveform obtained by the scope 110 to determine an in-plane positional relationship and the gap between the mold 106 and the substrate 104 with respect to a horizontal direction (XY direction) of a transfer surface.

The exposure amount control circuit 116 controls the UV light source 111 to perform light exposure.

The pressure detection circuit 117 calculates a pressure exerted between the mold 106 and the substrate 104 from a detection signal by the load cell 108 and an area of a portion to be processed.

The position control circuit controls the stage 102 so that the mold 106 and the substrate 104 can satisfy a desired positional relationship.

Incidentally, arrangements and methods of the respective mechanisms (means) are not limited to those in this embodiment, but may also include other constitutions, such as a constitution in which the mold 106 is moved instead of the substrate 104.

A pattern transfer step by imprinting in this embodiment will be described.

First, onto the substrate 104, the photocurable resin material 105 is applied by the dispenser 112 to be formed in a pattern forming layer.

Next, the mold 106 and the substrate 104 onto which the photocurable resin material 105 is applied are disposed opposite to each other and in a gap therebetween, the resin material is extended and filled while the positional relationship between the mold 106 and the substrate 104 is adjusted by using the scopes 109 and 110. In this state, a pressure exerted between the mold 106 and the substrate 104 is detected by the pressure detection circuit 117.

Next, the resin material between the substrate 104 and the mold 106 is irradiated with UV light emitted from the UV light source 111 to be cured.

Finally, the substrate 104 and the mold 106 are separated from each other to release the cured resin material from the mold 106.

Through the above steps, the surface projection/recess pattern of the mold 106 as an imprinting pattern is transferred onto the resin material layer on the substrate 104.

An alignment step and the pattern transfer step between the mold 106 and the substrate 104 will be described in detail.

The alignment between the mold 106 and the substrate 104 is performed by observing an alignment mark on the mold 106 and an alignment mark on the substrate 104 through the scope 109. The position detection circuit 115 performs image processing for detecting positions of the alignment marks by providing a threshold value to gradation (level) values of the image obtained by the scope 109, to detect an in-plane positional relationship between the mold 106 and the substrate 104.

Measurement of the gap between the mold 106 and the substrate 104 is effected by observing interference of broad-band light emitted from the scope 110 between the mold 106 and the substrate 104. Examples of the light source for emitting the broad-band light may include a halogen light source, a xenon light source, and the like. In the position detection circuit 115, the gap is calculated from a spatial refractive index, or the like, between the mold 106 and the substrate 104, by using the interference wave obtained by the scope 110. In the present invention, the gap measuring method between the mold 106 and the substrate 104 is not limited to this method. For example, in place of the broad-band light source, it is also possible to use a narrow-band light source, such as a laser, an LED, or the like.

Figure 3:
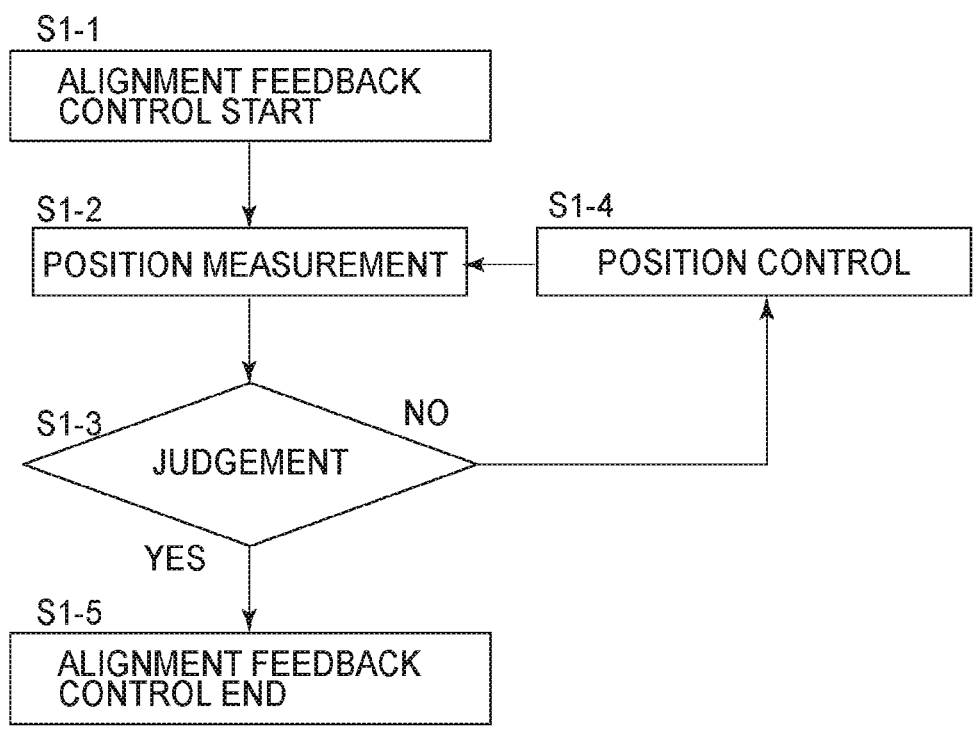
FIG. 3 is a flow chart illustrating a feedback control operation sequence in Embodiment 1-1 of the present invention.

FIG. 3 is a diagram for illustrating a feedback control operation sequence in the alignment step.

In a step S1-1, alignment feedback control is started.

In a step S1-2, a positional relationship between the mold 106 and the substrate 104 is measured.

Next, in a step S1-3, a difference between a measured value and a target value is judged as to whether or not it is within a reference value.

When the difference is not within the reference value, substrate positional control in a step S1-4 is effected. Thereafter, the measurement in the step S1-2 is performed again.

When the difference is within the reference value, the alignment feedback control is completed in a step S1-5. This feedback control is applicable to either one or both of in-plane alignment between the mold and the substrate and alignment concerning the gap between the mold and the substrate.

Figure 4:
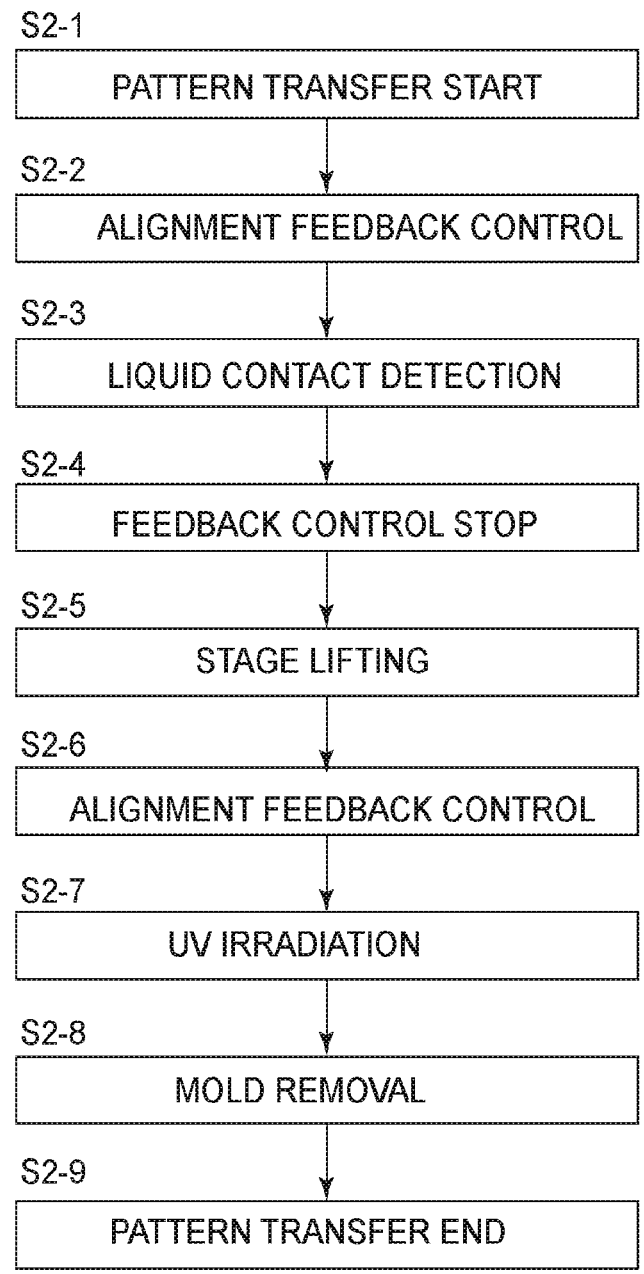
FIG. 4 is a flow chart illustrating a step of performing a feedback control operation in a pattern transfer step by imprinting in Embodiment 1-1 of the present invention.

FIG. 4 is a flow chart for illustrating steps for effecting feedback control in the pattern transfer process for imprinting (transferring) the pattern provided to the mold onto the resin material applied onto the substrate.

In a step S2-1, the pattern transfer process is started. In this state, the photocurable resin material 105 is applied onto the substrate 104 and the mold 106 does not contact the (liquid) resin material 105.

In a step S2-2, alignment feedback control is started.

Next, in a step S2-3, the contact of the mold 106 with the resin material 105 is detected and, then, in a step S2-4, the alignment feedback control is stopped.

After the alignment feedback control is stopped, in a step S2-5, the stage 102 is driven to bring the mold 106 and the substrate 104 close to each other by a certain distance to effect adjustment of a gap between the opposing surfaces of the mold 106 and the substrate 104.

After the photocurable resin material 105 contacts the mold 106 and completes a fluid state (control transition state), in a step S2-6, the alignment feedback control is resumed. After the alignment feedback control is completed, in a step S2-7, the photocurable resin material 105 is cured by UV light irradiation from the UV light source.

In a step S2-8, the mold 106 is released from the cured resin material 105 and then, in a step S2-9, the pattern transfer process is completed.

By these steps, the alignment feedback control can be effected so that a malfunction of the feedback control occurring during the contact between the mold 106 and the substrate 104 can be reduced, thus ensuring the imprinting.

When the mold 106 satisfies the accuracy required for positional deviation due to the contact between the mold 106 and the photocurable resin material 10, it is also possible to employ such a step that the photocurable resin material 105 is cured without effecting the alignment feedback control after the contact.

In some cases, a refractive index is changed by changing a substance (resin material) between the substrate 104 and the mold 106 to another substance, so that accurate gap measurement cannot be performed before and after the contact, thus resulting in difficulty of effecting the accurate feedback control. However, it is possible to obviate the difficulty by effecting the alignment feedback control for the gap only after the contact.

Figure 5A:
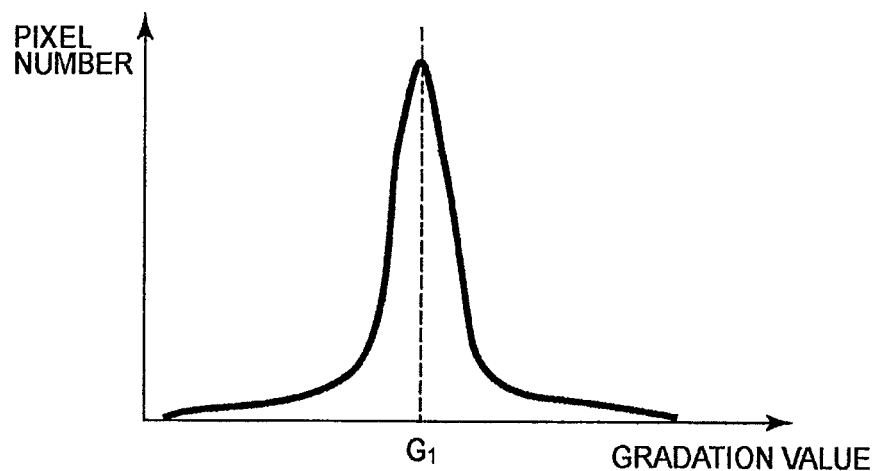
FIGS. 5(a), 5(b), 6 and 7 are graphs each illustrating detection of contact (liquid contact) between a mold and a resin material in Embodiment 1-1 of the present invention.
Figure 5B:
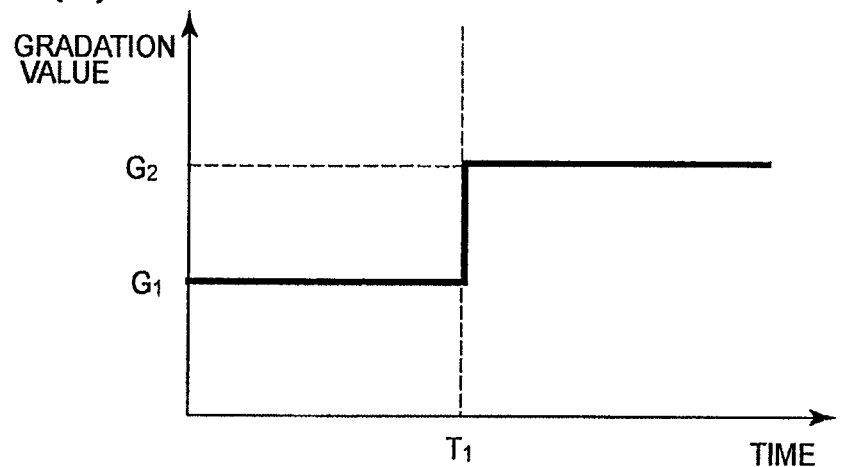

FIGS. 5(a) and 5(b) are graphs illustrating a method of detecting the contact between the mold 106 and the photocurable resin material 105.

FIG. 5(a) is a graph showing gradation values (levels) in a certain area of the image obtained by a scope 109 in the position detection circuit 115. In this case, the gradation value is $G_1$.

FIG. 5(b) is a graph showing a change of the gradation value of $G_1$ with time. A reflectance is changed when the mold 106 contacts the photocurable resin material 105, so that the gradation value is non-continuously changed from $G_1$ to $G_2$, as shown in FIG. 5(b).

Accordingly, at a time $T_1$ at which the gradation value is non-continuously changed, a judgment that the mold 106 and the photocurable resin material 105 contact each other is made.

As described above, by using the change in gradation value with time, it is possible to constitute the contact detection means.

Next, another constitution of the contact detection means for detecting the contact between the mold 106 and the photocurable resin material 105 will be described.

Figure 6:
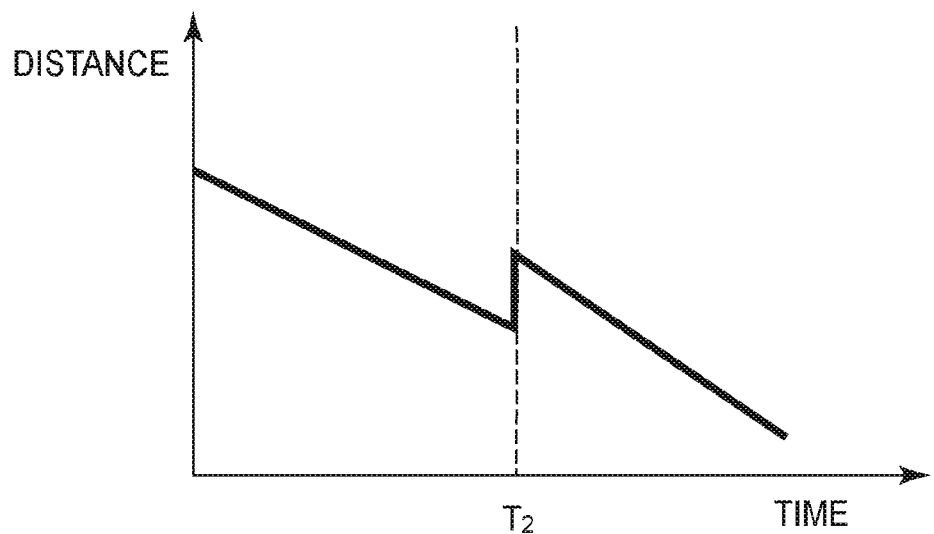

FIG. 6 is a graph showing a change with time of a measurement result of a gap (distance) between the mold 106 and the substrate 104 before and after the mold 106 and the photocurable resin material 105 contact each other. At a time $T_2$ shown in FIG. 6, the gap value is non-continuously changed. This is because a refractive index in an optical path of light used for measurement is changed from that of air to that of the photocurable resin material 105 by the contact of the mold 106 with the photocurable resin material 105. Although an actual refractive index is not changed, the gap measurement value is non-continuously changed when the mold 106 and the photocurable resin material 105 contact each other. Therefore, a judgment that the mold 106 and the photocurable resin material 105 contact each other, at the time $I_2$ at which the gap value is non-continuously changed, is made.

Another constitution of the contact detection means for detecting the contact between the mold 106 and the photocurable resin material 105 will be described.

Figure 7:
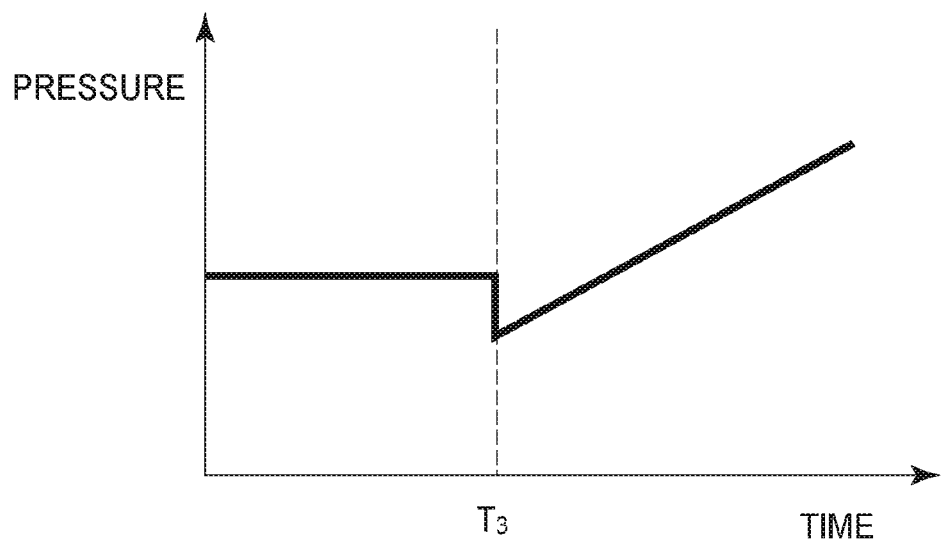

FIG. 7 is a graph showing a change with time of a pressure exerted between the mold 106 and the substrate 104 measured by the pressure detection circuit 117. As shown in FIG. 7, at a time $T_3$, a pressure which is constant until a measurement time reaches the time $T_2$ is changed. This is because the mold 106 contacts the photocurable resin material 105. Therefore, a judgment that the mold 106 and the photocurable resin material 105 contact each other, at the time $T_3$ at which the pressure is changed, is made.

In the present invention, even in constitutions other than the above-described three constitutions of the contact detection means, it is possible to apply means or methods capable of detecting the contact between the mold 106 and the photocurable resin material 106.

In this embodiment, in the alignment between the mold and the substrate 104, the feedback control for the alignment is stopped simultaneously with the detection of the contact between the mold 106 and the photocurable resin material 105.

By this operation, it is possible to reduce an occurrence of a malfunction of an alignment operation in a transition period during the contact between the mold 106 and the substrate 104. As a result, it is possible to perform high-speed processing capable of reducing breakage of the mold and the substrate.

The apparatus constitution as to the alignment between the mold 106 and the substrate 104 is not limited to that in this embodiment, but other methods capable of the alignment between the mold 106 and the substrate 104 may also be applicable.

Embodiment 1-2

Next, an imprinting method and an imprinting apparatus in this embodiment will be described.

A difference between this embodiment and Embodiment 1-1 is only an operation sequence in the pattern transfer process, so that only the pattern transfer process will be described.

Figure 8:
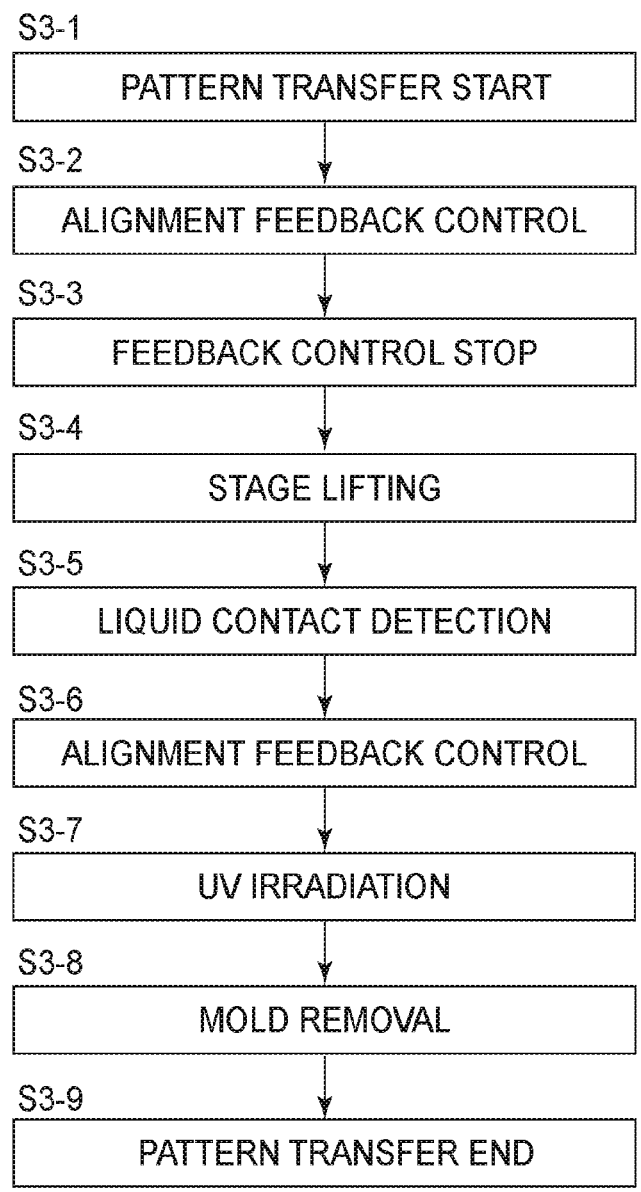
FIGS. 8 and 9 are flow charts each illustrating a step of performing a feedback control operation in a pattern transfer step by imprinting in Embodiment 1-2 (FIG. 8) or Embodiment 1-3 (FIG. 9) of the present invention.

FIG. 8 is a flow chart illustrating steps for effecting feedback control in the pattern transfer process for imprinting the pattern provided to the mold.

In a step S3-1, the pattern transfer process is started. In this state, the photocurable resin material 105 is applied onto the substrate 104 and the mold 106 does not contact the (liquid) resin material 105.

In a step S3-2, alignment feedback control is started.

Next, in a step S3-3, the feedback control is stopped when the mold 106 and the photocurable resin material 105 applied onto the substrate 104 are placed at predetermined positions in front of a contact position therebetween.

After the feedback control is stopped, in a step S3-4, the stage 102 is driven to bring the mold 106 and the substrate 104 close to each other to effect gap adjustment (gap control) between the opposing surfaces of the mold 106 and the substrate 104. That is, before the alignment feedback control is resumed in a step S3-6, performed later, the gap adjustment (gap control) is effected.

Next, in a step S3-5, the contact of the mold 106 with the resin material 105 is detected, and then, in step S3-6, the alignment feedback control is resumed.

After the alignment feedback control is completed, in a step S3-7, the photocurable resin material 105 is cured by UV light irradiation from the UV light source.

In a step S3-8, the mold 106 is released from the cured resin material 105 and then, in a step S3-9, the pattern transfer process is completed.

In this embodiment, in the alignment between the mold and the substrate 104, the feedback control for the alignment is stopped in advance during the contact between the mold 106 and the photocurable resin material 105. Then, the feedback control is resumed after detection of the contact.

By this operation, it is possible to reduce an occurrence of a malfunction of an alignment operation during the contact between the mold 106 and the substrate 104. As a result, it is possible to perform high-speed processing capable of reducing breakage of the mold and the substrate.

Embodiment 1-3

Next, an imprinting method and an imprinting apparatus in this embodiment will be described.

A difference between this embodiment and Embodiment 1-1 is only an operation sequence in the pattern transfer process, so that only the pattern transfer process will be described.

Figure 9:
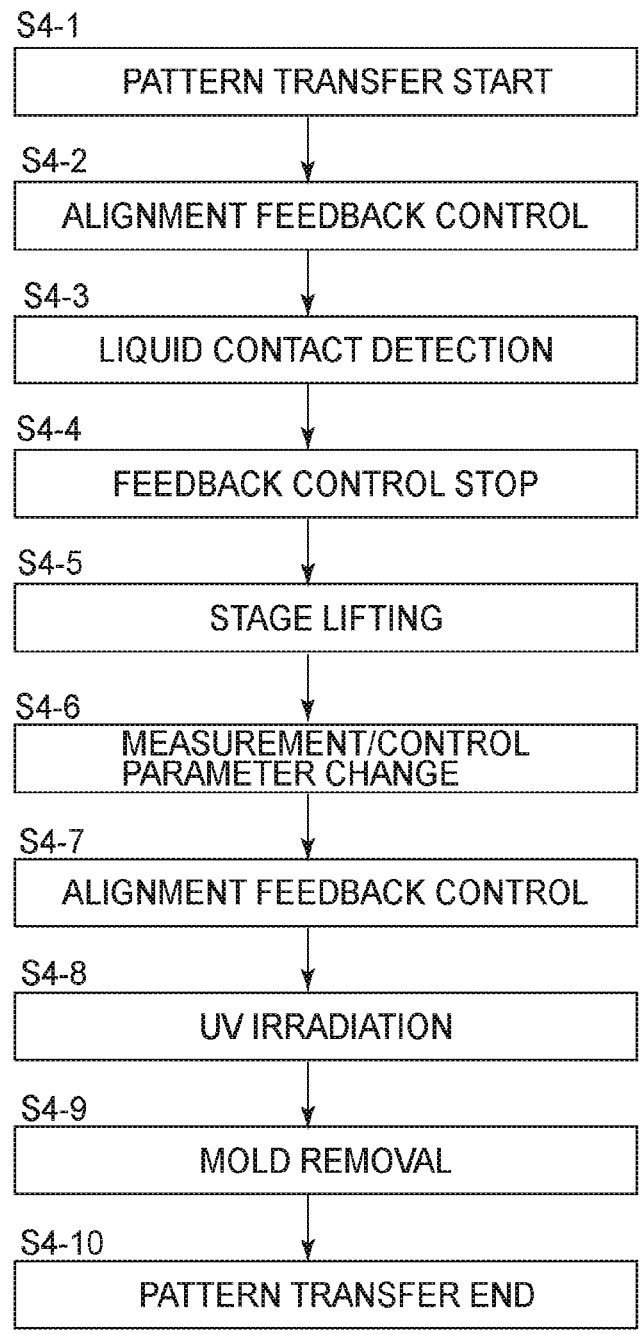

FIG. 9 is a flow chart illustrating steps for effecting feedback control in the pattern transfer process for imprinting the pattern provided to the mold.

In a step S4-1, the pattern transfer process is started. In this state, the photocurable resin material 105 is applied onto the substrate 104 and the mold 106 does not contact the (liquid) resin material 105.

In a step S4-2, alignment feedback control is started.

Next, in a step S4-3, when the contact of the mold 106 with the photocurable resin material 105 is detected, in a step S4-4, the alignment feedback control is stopped.

After the feedback control is stopped, in a step S4-5, the stage 102 is driven to bring the mold 106 and the substrate 104 close to each other by a certain distance to effect gap adjustment between the opposing surfaces of the mold 106 and the substrate 104.

After the contact transition state between the mold 106 and the photocurable resin material 105 is completed, in a step S4-6, a measurement/control parameter of the alignment feedback control is changed and then, in a step S4-7, the alignment feedback control is resumed.

After the alignment feedback control is completed, in a step S4-8, the photocurable resin material 105 is cured by UV light irradiation from the UV light source.

In a step S4-9, the mold 106 is released from the cured resin material 105 and then, in a step S4-10, the pattern transfer process is completed.

Incidentally, in the case wherein the mold 106 satisfies the accuracy required for positional deviation by the contact with the photocurable resin material 105, it is also possible to perform only the measurement after the contact, without effecting the feedback control.

Next, with reference to FIGS. 5(*a*) and 5(*b*), a change in position measurement parameter for in-plane alignment as an example of the change in measurement/control parameter will be described.

As described above, FIG. 5(*a*) is a graph showing gradation values in a certain area of the image obtained by the scope 109 in the position detection circuit 115, and FIG. 5(*b*) is a graph showing a change of a gradation value with time in the area. When the mold 106 contacts the photocurable resin material 105, as shown in FIG. 5(*b*), the gradation value in the area is changed from $G_1$ to $G_2$.

Therefore, the gradation value is changed as a whole by the contact of the mold 106 with the photocurable resin material 105, so that detection of the marks is difficult in some cases. For this reason, a threshold value of the gradation value for the mark detection is corrected so that the marks can be detected in a state after the contact.

Figure 10A:
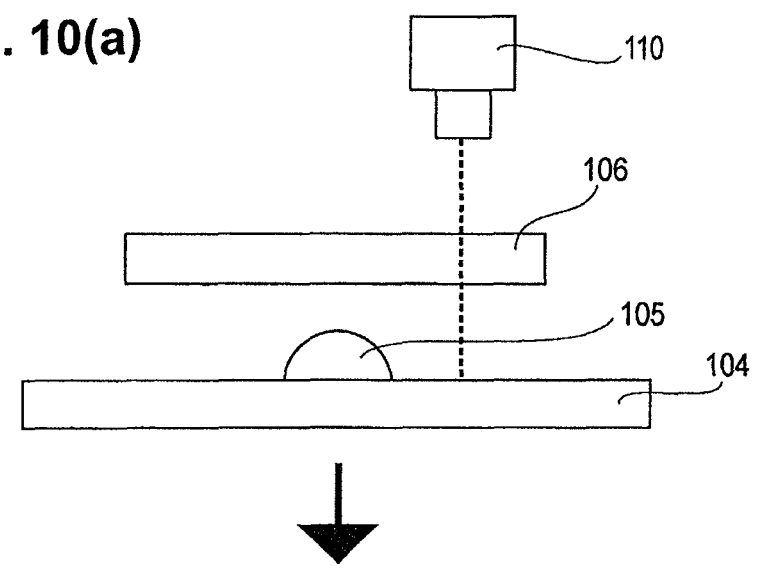
FIGS. 10(a) and 10(b) are schematic views illustrating an example of detection of contact between a mold and a resin material in Embodiment 1-3 of the present invention.
Figure 10B:
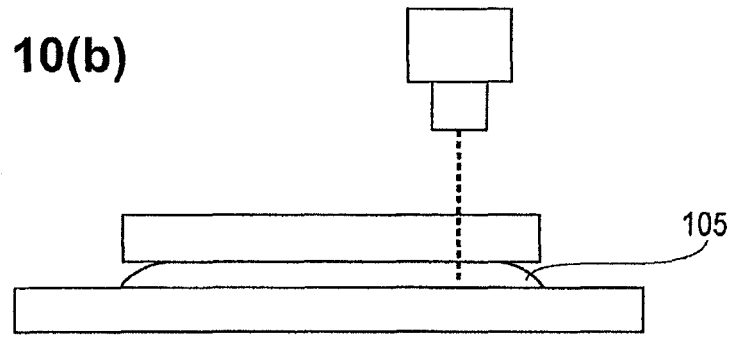

FIGS. 10(*a*) and 10(*b*) are schematic views illustrating a change in a gap measurement parameter as the distance measurement parameter for adjusting a distance (gap) between the mold 106 and the substrate 104. By the contact between the mold 106 and the photocurable resin material 105, as shown in these figures, a substance between the mold 106 and the substrate 104 located below the scope 110 is changed from air to the photocurable resin material 105. By this change of the substance, a refractive index in an optical path for measuring the gap is changed, so that a gap (distance) measurement result can be an erroneous value. For this reason, the refractive index used for calculating the gap is changed from that of air to that of the photocurable resin material 105.

FIGS. 11(*a*) and 11(*b*) are graphs illustrating a change in stage drive control parameter as a drive control parameter for performing an alignment operation between the mold and the substrate as another embodiment for changing the measurement/control parameter.

By the contact of the mold 106 with the photocurable resin material 105, as shown in FIG. 11(*a*), a pressure exerted between the mold 106 and the substrate 104 can be changed. In this case, a time $T_4$ represents a contact time of the mold 106 with the photocurable resin material 105.

Before and after the contact of the mold 106 with the photocurable resin material 105, the pressure exerted from the mold 106 and the control 104 is changed from 0 to $P_1$.

With this pressure change, a pressure exerted on the stage is also changed, so that a parameter such as a gain, or the like, for driving the stage is corrected in order to drive the stage with high accuracy.

Figure 11A:
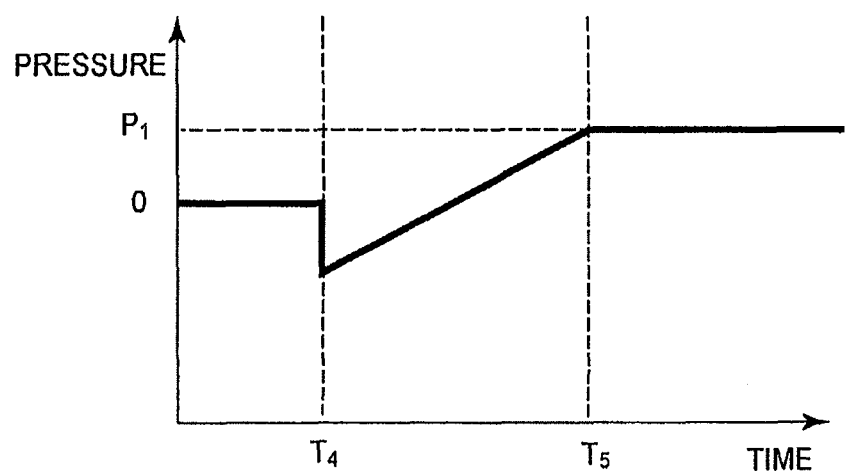
FIGS. 11(a) and 11(b) are graphs each illustrating a change in measurement/drive parameter in Embodiment 1-3 of the present invention.
Figure 11B:
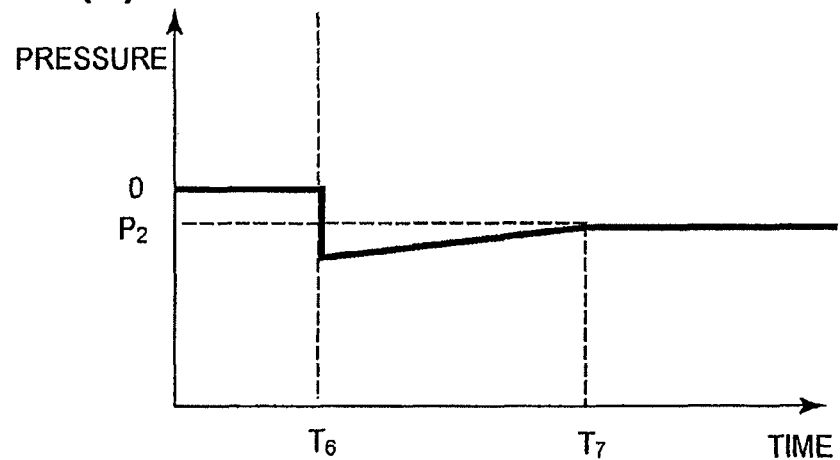

Further, the state of the pressure change during the pattern transfer is not limited to that shown in FIG. 11(a), but can also be that shown in FIG. 11(b), in which the pressure is changed from $P_2$ to 0, so that the pressure can be applied so that the mold and the substrate attract each other.

The change in measurement/control parameter for the alignment feedback control is not limited to using the change described above, but may also be a change corresponding to a physical change caused by the contact of the mold and the resin material with respect to the feedback control.

In this embodiment, in the alignment between the mold and the substrate 104, the feedback control for the alignment is stopped simultaneously with the detection of the contact between the mold 106 and the photocurable resin material 105. Then, the feedback control is resumed after measurement/control parameter for the feedback control is changed.

By this operation, it is possible to reduce an occurrence of a malfunction of an alignment operation during the contact between the mold 106 and the substrate 104. As a result, it is possible to perform high-speed processing capable of reducing breakage of the mold and the substrate.

Incidentally, the step of changing the measurement/control parameter for the feedback control is not limited to that in this embodiment, but may also be a step of changing a parameter in stages during the contact between the mold 106 and the photocurable resin material 105.

Embodiment 1-4

Next, an imprinting method and an imprinting apparatus in this embodiment will be described.

A difference between this embodiment and Embodiment 1-3 is only an operation sequence in the pattern transfer process, so that only the pattern transfer process will be described.

Figure 12:
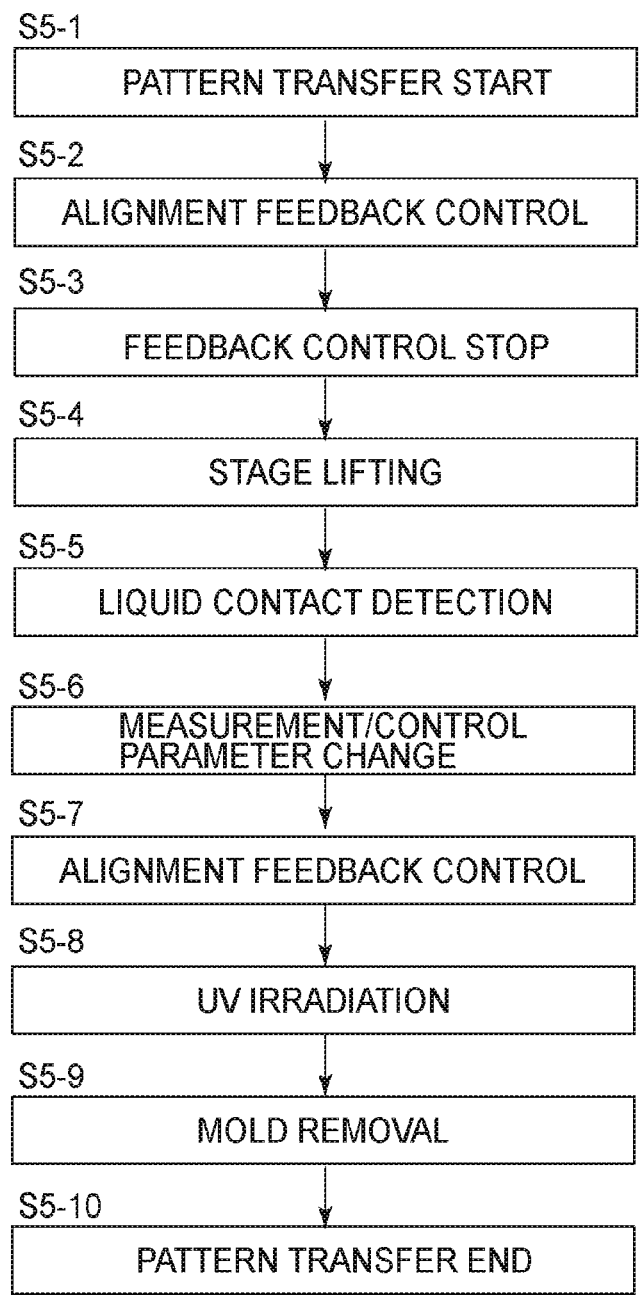
FIG. 12 is a flow chart illustrating a step of performing a feedback control operation in a pattern transfer step by imprinting in Embodiment 1-4 of the present invention.

FIG. 12 is a flow chart illustrating steps for effecting feedback control in the pattern transfer process for imprinting the pattern provided to the mold.

In a step S5-1, the pattern transfer process is started. In this state, the photocurable resin material 105 is applied onto the substrate 104 and the mold 106 does not contact the (liquid) resin material 105.

In a step S5-2, alignment feedback control is started.

Next, in a step S5-3, the feedback control is stopped when the mold 106 and the photocurable resin material 105 applied onto the substrate 104 are placed at predetermined positions in front of a contact position therebetween.

After the feedback control is stopped, in a step S5-4, the stage 102 is driven to bring the mold 106 and the substrate 104 close to each other to effect gap adjustment (gap control) between the opposing surfaces of the mold 106 and the substrate 104. That is, before the alignment feedback control is resumed (the control parameter is changed in a step S5-6, performed later), the gap adjustment (gap control) is effected.

Next, in a step S5-5, the contact of the mold 106 with the resin material 105 is detected and the measurement/control parameter for the alignment feedback control is changed in step S5-6, and thereafter, the alignment feedback control is resumed in a step S5-7.

After the alignment feedback control is completed, in a step S5-8, the photocurable resin material 105 is cured by UV light irradiation from the UV light source.

In a step S5-9, the mold 106 is released from the cured resin material 105 and then, in a step S5-10, the pattern transfer process is completed.

In this embodiment, in the in-plane alignment between the mold and the substrate 104, the feedback control for the alignment is stopped in advance during the contact between the mold 106 and the photocurable resin material 105. Then, after detection of the contact, the measurement/control parameter is changed and the feedback control is resumed.

By this operation, it is possible to reduce an occurrence of a malfunction of an alignment operation during the contact between the mold 106 and the substrate 104. As a result, it is possible to perform high-speed processing capable of reducing breakage of the mold and the substrate.

Further, as another alignment method, it is possible to employ the following method.

First, a first member and a second member contacting a fluid material are disposed opposite to each other. The first member may include the above-described mold and a lens used for an immersion exposure apparatus. The fluid material may include the above-described photocurable resin material, a liquid, such as water, and a gel-like material. The second member may include, e.g., quartz or a wafer, such as a semiconductor wafer, and may desirably be a flat plate-like material, such as a so-called Si wafer.

Next, as described above, in a state in which the first member and the second member contacting the fluid material are disposed opposite to each other, alignment between the first member and the second member is effected with feedback control. Here, the alignment may include at least one of in-plane alignment of the first plate-like member and alignment with respect to a gap between the first member and the second member.

Then, while effecting the feedback control, the gap is gradually decreased and by utilizing information about contact between the first member and the fluid material, the feedback control is stopped or a control condition in the feedback control is changed. Here, the information about the contact means information showing contact between the first member and the fluid material, information showing a lapse of a predetermined time after the contact, or information showing a predetermined state after the contact.

As described above, by stopping the feedback control or changing the parameter (condition) therefor, it is possible to prevent a malfunction caused by the contact between the first member and the fluid material (which are originally not in contact with each other, but are in contact with each other during the alignment).

As a result, it is possible to realize an alignment method in which the first member and the second member contacting the fluid material are disposed opposite to each other, and the alignment between the first member and the second member is effected with feedback control, and then the feedback control is stopped or the control condition in the feedback control is changed by utilizing the information about the contact between the first member and the fluid material.

The alignment method according to the present invention is applicable to not only the above-described imprinting apparatus, but also, an immersion exposure apparatus, and the like.

Incidentally, the members or means described in Embodiment 1-1 to Embodiment 1-4 with reference to FIG. 2 to FIG. 12 may include the casing 101, the stage 102, the substrate holding portion 103, the substrate 104, the photocurable resin material 105, the mold 106, having a pattern at its processing surface, the mold holding portion 107, and load cell 108, the scopes 109 and 110, the UV light source 111, the dispenser 112, the process control circuit (means) 113, the application control circuit 114, the position detection circuit (means) 115, the exposure amount control circuit 116, the pressure detection circuit 117, and the position control circuit (means) 118.

Hereafter, embodiments according to the second aspect of the present invention will be described.

Embodiment 2-1

With reference to the drawings, Embodiment 2-1 will be described specifically.

Depending on the constitution and various conditions for an apparatus to be applied, this embodiment may be appropriately modified or changed.

In this embodiment, a substrate onto which a resin material is applied is brought into contact with a fixed mold by movement of a stage to effect imprinting. Further, alignment between the mold and the substrate is effected by such a global method that several points are measured in advance and a target position is set for each chip from a measurement result.

Figure 13:
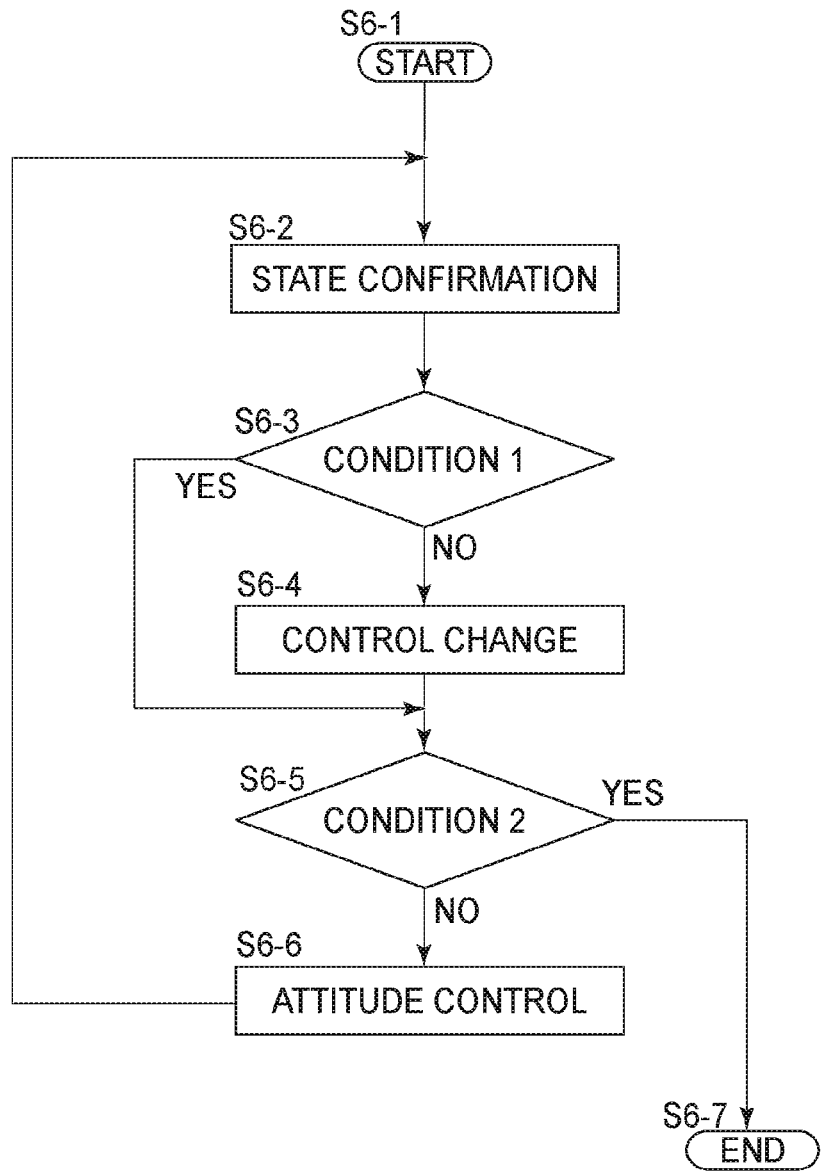
FIG. 13 is a flow chart illustrating a step of effecting imprinting with respect to a chip in Embodiment 2-1 of the present invention.

FIG. 13 is a flow chart illustrating steps for performing imprinting with respect to one chip.

In this embodiment, the mold and the substrate are brought near to each other in a direction (z) perpendicular to their opposing surfaces on the basis of a preset profile. This profile is set so that values of the mold and the substrate in in-plane directions (x, y and θ) are kept at the same levels.

First, in a step S6-1, the mold and the substrate, onto which the resin material is applied, are disposed opposite to each other and are placed in an imprintable state.

In a step S6-2, a predetermined state is confirmed.

This state confirmation is performed by:

(1) measuring a load exerted on the mold or the substrate and measuring a torque of the stage, (2) measuring a distance between the mold and the substrate and a position of the stage, (3) judging the presence or absence of contact between the mold and the substrate, or the like.

Next, in a step S6-3, a subsequent step is determined by judging whether or not the information obtained in the step S6-2 satisfies a condition. This condition is, e.g., the case wherein a deviation between a target position and a current position and positional vibration are smaller than set values.

When the condition is satisfied, the step goes to step S6-5. When the condition is not satisfied, a change in control is made in a step S6-4. The change in control may include changes in a control parameter, a drive profile, and the like, of a control mechanism. The change in control may also include a change in control method for switching ON and OFF of feedback control.

After the change in control is made, the step goes to a step S6-5, in which a judgment, as to whether or not an end condition is satisfied, is made. The end condition may include a state in which the stage is located at a target value (position).

When the end condition is satisfied, the step goes to a step S6-7. When the end condition is not satisfied, in a step S6-6, an attitude of the stage is controlled. This control is effected on the basis of the drive profile after being changed with respect to the Z direction. In this case, depending on the profile, a start time of UV irradiation for curing the resin material and an irradiation duration are changed.

Next, the control of the stage in this embodiment will be described.

Figure 14A:
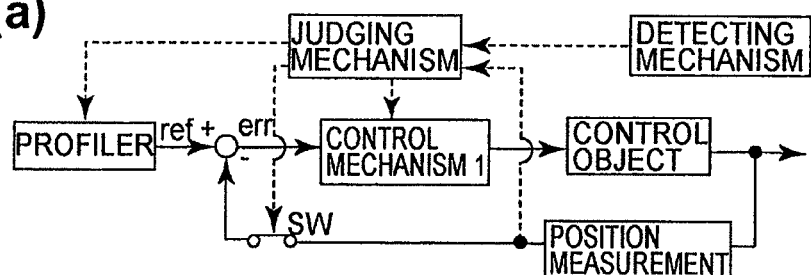
Figure 14B:
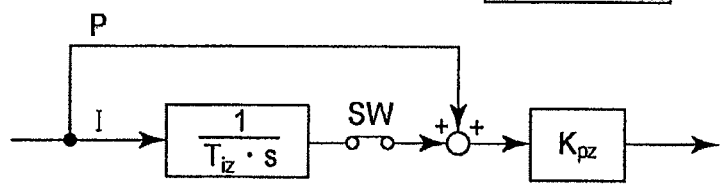
Figure 14C:
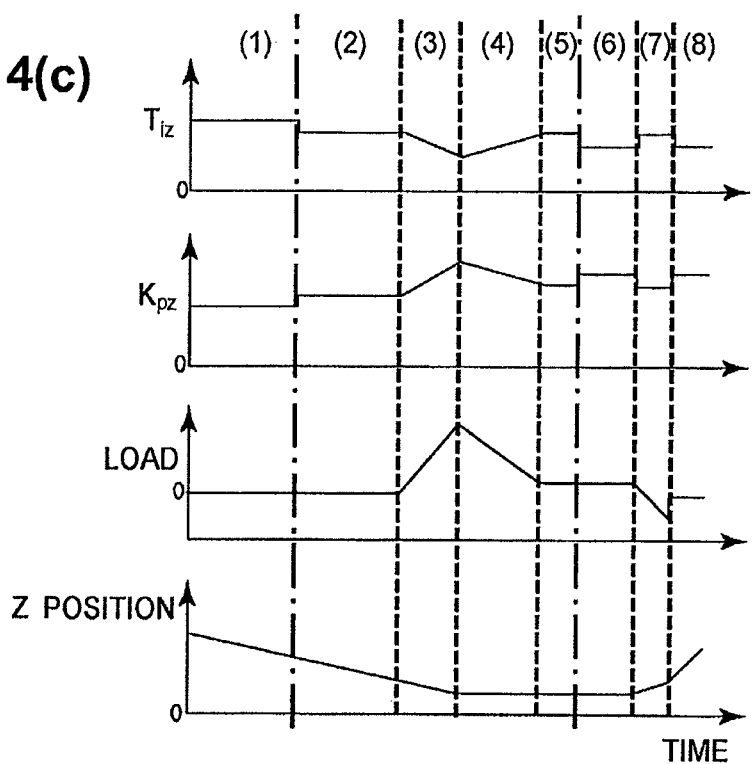

FIGS. 14(a) to 14(c) are schematic diagrams illustrating the stage control in this embodiment, in which FIG. 14(a) is a control block diagram, FIG. 14(b) is a diagram for illustrating a PI control mechanism, and FIG. 14(c) is a time chart.

Referring to FIG. 14(a), a profiler sets a target value of the stage on the basis of a preset stage drive profile. Into a control mechanism 1, a reference signal (ref) sent from the profiler and a deviation (err) between the reference signal and a position measurement result are inputted. This control mechanism 1 is, e.g., a mechanism for PI control with respect to proportional and integral operations. Further, the control block includes a switch (SW) capable of turning on and off a feedback switch.

FIG. 14(b) shows a constitution of the PI control, wherein Kp represents a proportional gain, Ti represents an integral time, and s represents a Laplace operator. Further, z is an inferior letter and represents a z-axis parameter.

It is also possible not to effect the integral control by the switch. The control mechanism 1 further includes filters, such as a low-pass filter, a band-pass filter, and a notch filter, and is capable of performing setting of a filter parameter, such as the order and frequency of the filters.

The signal sent from the control mechanism 1 is inputted into an object to be processed. The object to be processed is each of the axes of the stage.

An actual signal is set to a motor for driving the stage. Into a judging mechanism, data measured (detected) by a detecting mechanism such as not only these for position measurement, but also, a load exerted on the mold or the substrate. The judging mechanism provides an instruction to change a control parameter or a drive profile for the substrate mechanism 1. The control parameter includes any of a PID parameter, a feedforward parameter, and a filter parameter. The drive profile may include not only a position of the stage, but also, an acceleration, a speed, a drive voltage, and a drive speed of the stage.

With reference to FIG. 14(c), a stage of imprinting control will be described. FIG. 14(c) shows a profile of z-position during imprinting, in which the substrate is brought near to the mold and the resin material contacts the mold and is cured, and then, released from the mold. Specifically, FIG. 14(c) is a time chart of a drive profile when the stage is moved in a direction of a normal (z) to the substrate. Other drive profiles with respect to in-plane direction (xy) of the portion and other axes (θαβ) are also present. Incidentally, the xy profile is a drive profile that keeps the same value.

In FIG. 14(c), (1) is an area in which the mold and the (liquid) resin material on the substrate do not contact each other, (2) to (5) are areas in which the mold and the resin material contact each other, (6) is an area in which the resin material is cured by UV light, (7) is an area in which the mold is released from the resin material, and (8) is an area in which the mold is retracted from the contact area.

In this case, a drive profile for the z direction is not changed. By this profile, when the z-position is moved, a time change (variation) in load exerted on the mold is observed. Based on data of the load, the proportional gain Kpz and the integral time Tiz with respect to the z direction are changed. These states are inclusively shown in FIG. 14(c). The proportional gain and the integral time are set for each of the axes. However, the state of change and the control for each axis are identical, so that those for the z-axis are described as an example.

In the area (1), the load is not changed, since the mold and the resin material do not contact each other.

In the area (2), the mold and the resin material contact each other. The z-direction load is merely changed to a negligible degree, but a viscous resistance is increased. At this time, a deviation is liable to occur, so that the proportional gain is increased and the integral time is decreased. In the case wherein a behavior immediately after the contact is not stabilized, it is also possible to set such a profile that the feedback control is turned off in advance immediately before the contact is turned on after the contact. Further, when a stage speed is sufficiently large or a viscosity is large, the load can be increased with the change in z-position.

In the area (3), the load exerted on the mold is increased with a decreasing distance between the mold and the resin material. In this area, depending on the load, the proportional gain is increased and the integral time is decreased.

In the area (4), the load is decreased after a target value of the substrate becomes constant. In this area, depending on the load, the proportional gain is decreased and the integral time is increased. There is also the case wherein there is no load-decreasing area depending on an application state of the resin material.

In the area (5), a substantially steady state is established. The load can be a negative value showing an attractive force. The load value is changed depending on a gap between the mold and the substrate, an amount of the resin material, and a contact area of the resin material. For example, the load value is changed by a difference in resin amount among the case wherein a sufficient amount of the resin material is present at even the outside of the mold, the case wherein the resin material is present in a region close to edges of the mold, and the case wherein the resin material is present only at a part of the mold. Incidentally, a decrease in load by diffusion of the resin material is less apt to give a reason for the negative value. Such a phenomenon that the load becomes the negative value is characteristic of the imprinting in recent years. This may be attributable to the use of a low-viscosity resin material, a gap of about several tens of nanometers, no application of a large pressure to the mold and the resin material, and the like. Accordingly, the reason why the load becomes the negative value can be considered that the load is largely affected by a surface tension or a capillary action. Depending on the load, the control parameter is set.

In the area (6), UV irradiation is performed. By the UV irradiation, the viscosity of the resin material is increased, with the result that the resin material is solidified. In the case wherein the value is deviated from the target value, the value is not returned to the target value until the stage is largely moved. For this reason, the proportional gain is increased and the integral time is decreased. Incidentally, in the case wherein the load requires a time to be placed in a steady state, the UV irradiation may also be performed before the load is placed in the steady state, depending on the load, the deviation, or the time.

In the area (7), the release between the mold and the substrate is started, but the mold and the resin material are separated from each other. In this area, the control parameter is changed depending on the load.

In the area (8), the mold and the substrate are separated from each other. In this case, the load is not changed, so that the control parameter is constant.

Incidentally, setting of the change is determined by performing imprinting for knowing a condition in advance. For example, there are the following four cases (1) to (4);

(1) in the case wherein the mold contacts the resin material and the load is not changed, the proportional gain is kept at a constant value, (2) in the case wherein the mold contacts the resin material and the load is changed, the proportional gain is changed depending on the change.

(3) in the case wherein the resin material is cured, the proportional gain is kept at a constant level, and (4) in the case wherein the release is performed, the proportional gain is changed depending on the load.

A value for judging the condition may include, in addition to a change in detected value, a change in differential coefficient (including a change in sign), a second-order differential coefficient (including a change in sign), and the like.

The above-described drive profile and control parameter are described as an example, so that they may be changed depending on a component, viscosity, amount, and the like, of the resin material.

Figure 15:
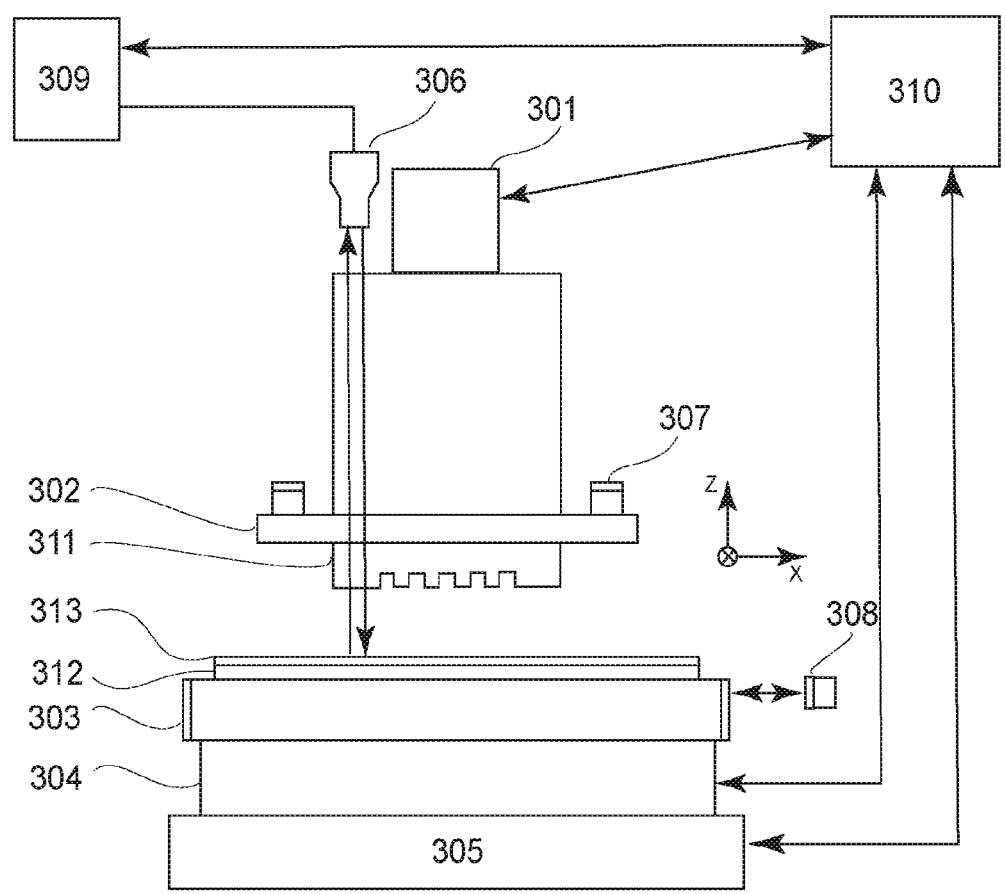
FIG. 15 is a schematic view illustrating a constitution of an imprinting apparatus in Embodiment 2-1 of the present invention.

Next, an imprinting apparatus in this embodiment, to which the present invention is applied, will be described. FIG. 15 shows a constitution of the imprinting apparatus. Referring to FIG. 15, the imprinting apparatus includes an exposure light source 301, a mold molding portion 302, a substrate holding portion 303, a substrate lifting mechanism 304, an in-plane moving mechanism 305, an optical system 306 for measuring a relative position between the mold and the substrate, and an analyzing mechanism 309 for calculating the relative position.

In the global method in this embodiment, the drive profile of the stage is set for each chip on the basis of a measurement result.

The optical system 306 is capable of measuring the presence or absence of contact between the mold and the resin material. For example, there is a method in which entrance of the resin material into a picture area is observed and a method in which a change in amount of light entering the resin material is observed.

The imprinting apparatus further includes a load cell 307 and an interference meter 308 for measuring a displacement.

Also, by this interference meter, it is possible to measure the presence or absence of contact of the resin material. For example, there is a method in which an oscillation component of an interferometer or an amplitude of noise is measured, and the resin material is judged to contact the mold by a decrease in degree of the oscillation due to the contact of the resin material. As another measuring method, it is also possible to employ a method in which a torque of a motor for the stage is measured. The torque can be calculated by measuring a current applied to the motor.

The imprinting apparatus includes a mold 311, a substrate 312, and a photocurable resin material 313. The mold holding portion 302 effects chucking of the mold 311 by a vacuum chucking method, or the like. The substrate 312 is movable to a desired position by the in-plane moving mechanism 305, and by the substrate lifting mechanism 304, height adjustment and pressure application with respect to the substrate 312 can be performed.

Control of the position measurement, pressure application, light exposure, and the like, with respect to the substrate 312, are performed by an imprinting control mechanism 310. The imprinting control mechanism 310 includes the profiler, the judging mechanism and the control mechanism shown in FIG. 14(*a*).

Embodiment 2-2

With reference to the drawings, Embodiment 2-2 of the present invention will be described.

In this embodiment, the case wherein a control condition is different between x-direction and z-direction will be described.

Figure 17:
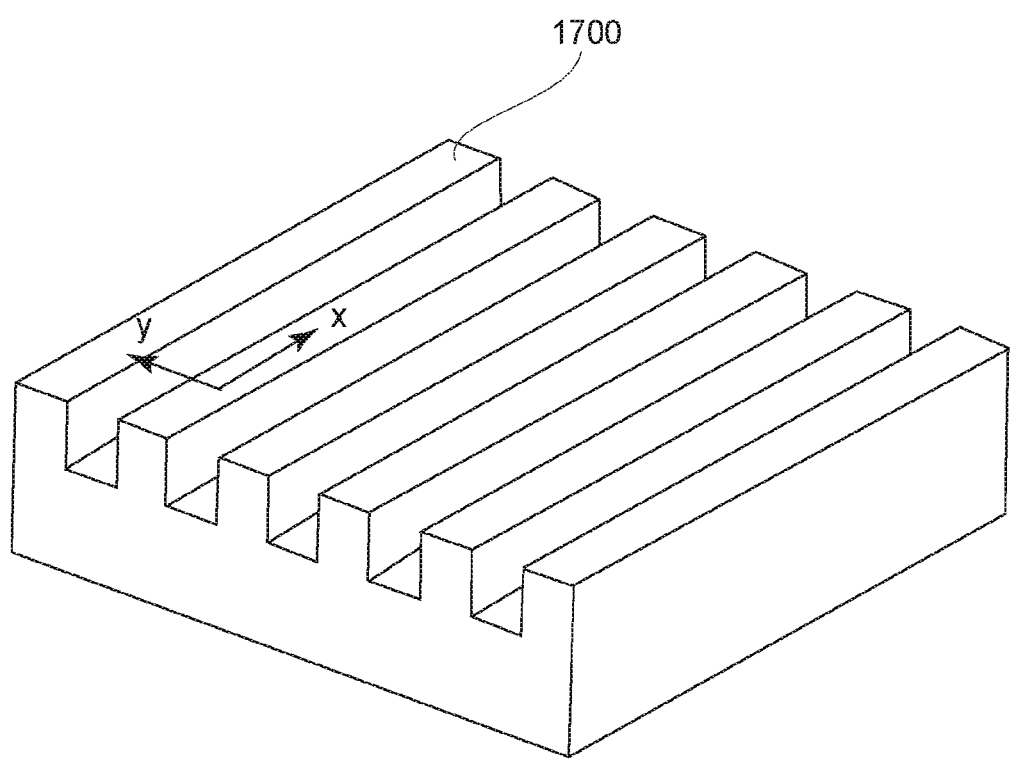
FIG. 17 is a perspective view showing a mold in Embodiment 2-2 of the present invention.

FIG. 17 shows a mold 1700 having a line-and-space pattern in this embodiment.

In FIG. 17, the x-direction is a line direction and the y-direction is a direction perpendicular to the line direction. In such a structure, the resin material is liable to extend in the x-direction and is less liable to extend in the y-direction. In this case, a change in control condition, such as a control parameter, a control method, a drive profile, or the like, for each axis, is particularly effective. Here, the resin material is less liable to extend in the y-direction, so that the case wherein the mold receives a pressure in the y-direction to cause a deviation in the y-direction will be considered. However, this relationship is affected by a surface treatment and shape of the mold and a characteristic of the resin material, so that the deviation is liable to occur in the x-direction, in some cases.

In this embodiment, similarly as in Embodiment 2-1, a substrate onto which a resin material is applied is brought into contact with a fixed mold by movement of a stage to effect imprinting. Further, alignment between the mold and the substrate is effected by a die-by-die method performed for each chip. In the die-by-die method, the alignment is effected while measuring a change in in-plane relating position between the mold and the substrate is measured for each chip.

Figure 18:
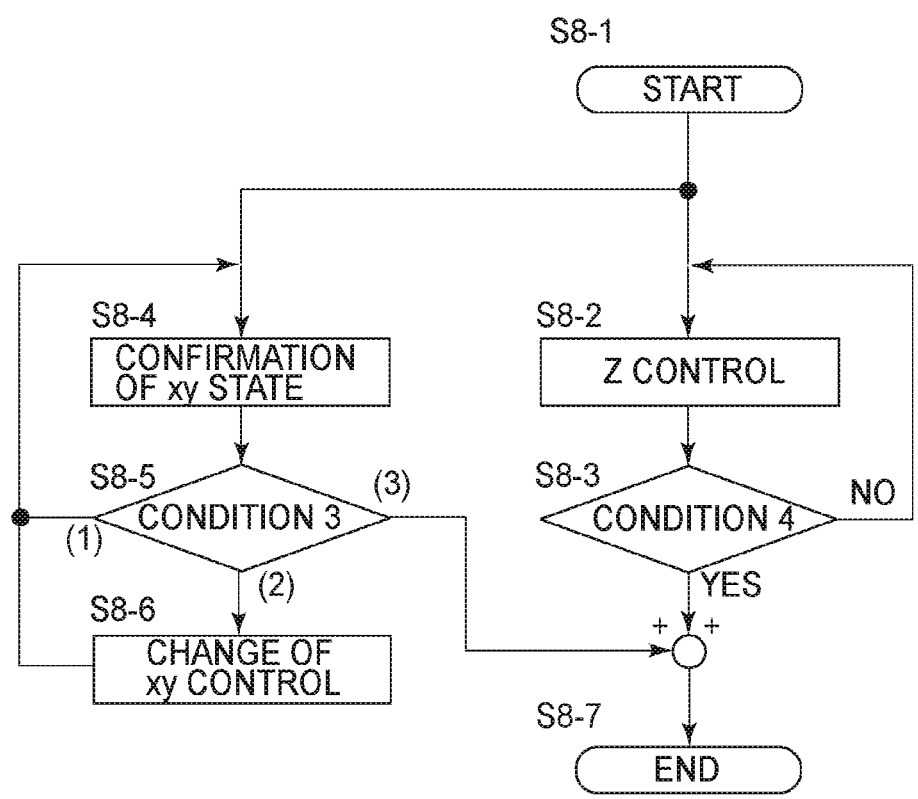
FIG. 18 is a flow chart illustrating steps for effecting imprinting with respect to a chip in Embodiment 2-2 of the present invention.

FIG. 18 is a flow chart illustrating steps for performing imprinting with respect to one chip.

In this embodiment, the mold and the substrate are brought near to each other in a direction (z) perpendicular to the substrate on the basis of a preset drive profile. This drive profile is set so that values of the mold and the substrate in in-plane directions (x, y and θ) are kept at the same levels.

First, in a step S8-1, the mold and the substrate, onto which the resin material is applied, are disposed opposite to each other and are placed in an imprintable state by measuring a relative position between the mold and the substrate and effecting alignment therebetween so as to provide their described positions.

Next, the step goes to a z-control step S8-2 and an xy-control step S8-4. These steps are so-called parallel control.

In the step S8-4, an xy-state is confirmed.

The xy-state is confirmed by measuring a load exerted on the mold or the substrate and measuring a relative distance between the mold and the substrate.

Next, in a step S8-5, a subsequent step is determined by judging that any of the following three conditions (1), (2) and (3) is satisfied. These conditions are: (1) a case wherein a deviation between a target position and a current position and positional vibration are smaller than set values; (2) a case wherein these values are larger than the set values; and (3) a case of an end condition.

In the case wherein the step goes from the step S8-5 to the step S8-6, in the step S8-6, the control condition with respect to the xy-direction is changed so as to always be within a predetermined value.

In the case wherein the step goes from the step S8-2 to a step S8-3, in the step S8-3, a condition 4 is whether or not an end condition is satisfied. When the end condition is not satisfied, the z-control is effected in the step S8-2. When the end condition is satisfied, the step goes to a step S8-7, in which the step is completed.

Next, imprinting in this embodiment will be described.

Figure 19:
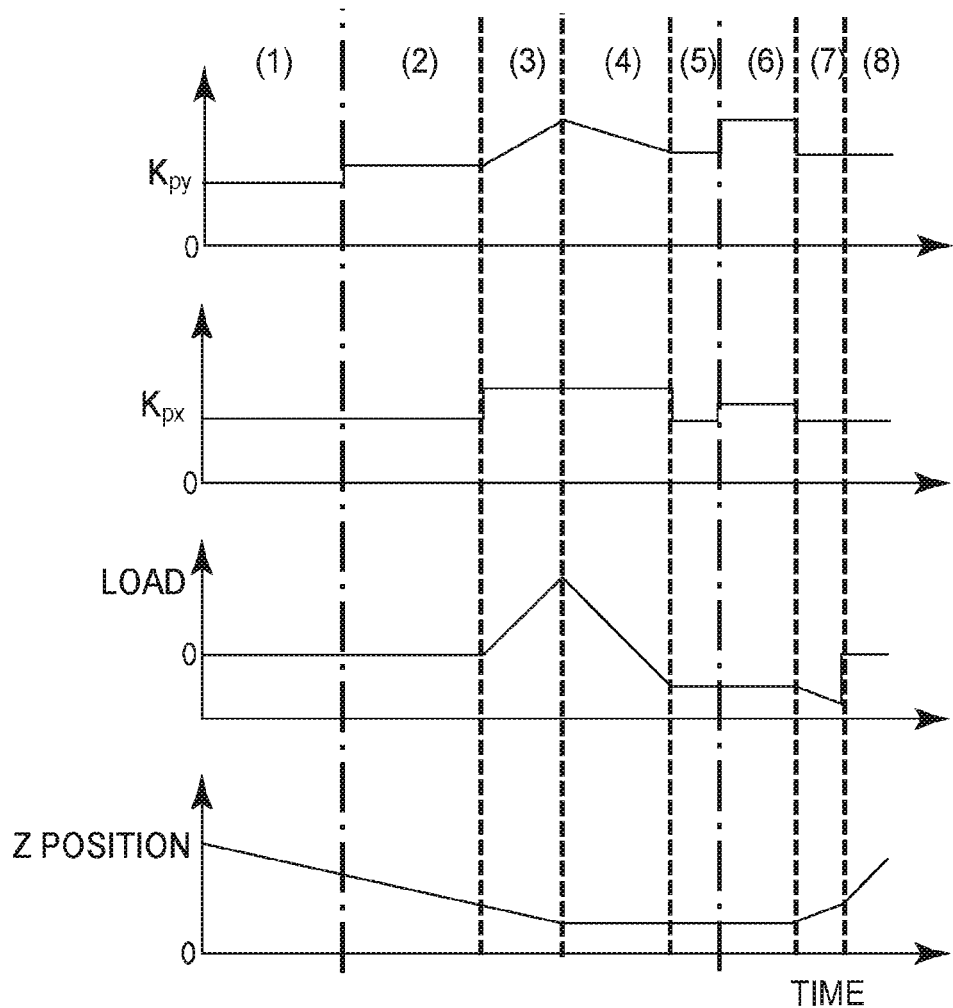
FIG. 19 is a time chart illustrating a state of the imprinting in Embodiment 2-2 of the present invention.

FIG. 19 is a time chart for illustrating a state of the imprinting in this embodiment, wherein a drive profile is not changed. The time chart includes a z-position profile, a change with time of a load exerted on the mold, a proportional gain Kpx with respect to the x-direction on the basis of the load data, and a proportional gain Kpy with respect to the y-direction.

In the area (1), the load is not changed, since the mold and the resin material do not contact each other. In this area, the control parameter is identical.

In the area (2), the mold and the resin material contact each other, but the z-direction load is merely changed to a negligible degree. The resin material is liable to diffuse in the x-direction, but is less liable to diffuse in the y-direction, so that a deviation is liable to occur by fluidity of the resin material. In this case, with respect to the y-direction, the proportional gain is increased, as compared with that with respect to the x-direction.

In the area (3), the load exerted on the mold is increased with a decreasing distance between the mold and the resin material. In this area, depending on the load, the proportional gain is increased with respect to the y-direction. With respect to the x-direction, a constant proportional gain is set, irrespective of the load.

In the area (4), the load is decreased after a target value of the substrate becomes constant. In this area, depending on the load, the proportional gain with respect to the y-direction is decreased. With respect to the x-direction, a constant proportional gain is set, irrespective of the load.

In the area (5), a substantially steady state is established. The load can be a negative value showing an attractive force. Depending on the load, the control parameter is set with respect to each of the x- and y-directions.

In the area (6), UV irradiation is performed. Incidentally, in the case wherein the load requires a time to be placed in a steady state, the UV irradiation may also be performed before the load is placed in the steady state, depending on the load, the deviation, or the time. By the UV irradiation, the resin material contracts or expands. With respect to the y-direction, a positional error is liable to occur the by influence of the contraction or the expansion, so that the proportional gain is increased. By the UV irradiation, a change in the load can be caused to occur. Specifically, depending on the resin material component or a contact state of the resin material with the mold, the load is left at a negative value or changed from the negative value to a positive value, in some cases. These phenomena are reproducible, so that a change in control method, such as switching (ON/OFF) of feedback control is made, corresponding to a state of the change.

In the area (7), the release between the mold and the substrate is started, but the mold and the resin material are separated from each other. In this area, the resin material is solidified, so that a constant proportional gain is set with respect to both of the x- and y-directions.

In the area (8), the mold and the substrate are separated from each other. In this case, the load is not changed, so that the proportional gain is constant.

Embodiment 2-3

With reference to the drawing, Embodiment 2-3 of the present invention will be described.

In this embodiment, a control condition, including a combination of feed forward control and feedback control, is employed.

In the imprinting, a part of factors capable of becoming a cause of a disturbance, such as control between the mold and the resin material, UV irradiation, and the like, is known in advance, so that the control condition described above is effective in such a case of an occurrence of the disturbances.

Particularly, in the case wherein only the feedback control is employed, it takes time to detect an influence of the disturbance after the disturbance occurs. The control condition including the combination of the feedforward control and the feedback control is effective for obviating a delay in response.

Figure 20A:
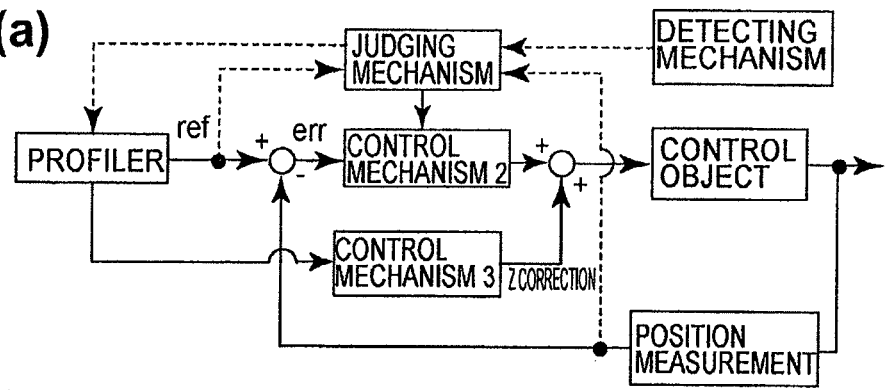
Figure 20B:
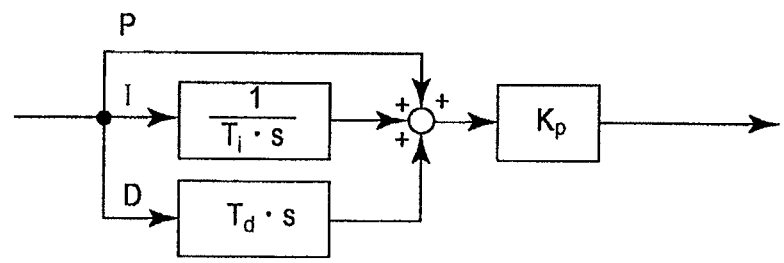
Figure 20C:
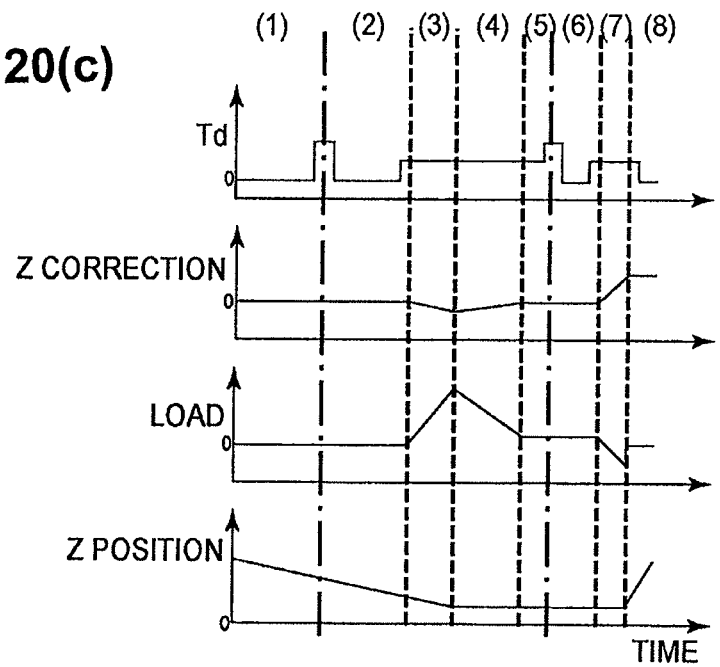

FIGS. 20(a) to 20(c) are schematic diagrams illustrating the stage control in this embodiment, in which FIG. 20(a) is a control block diagram, FIG. 20(b) is a diagram for illustrating a PI control mechanism, and FIG. 20(c) is a time chart.

Referring to FIG. 20(a), a profiler sets a target value of the stage on the basis of a preset stage drive profile. Into a control mechanism 2, a reference signal (ref) sent from the profiler and a deviation (err) between the reference signal and a position measurement result are inputted. This control mechanism 2 is, e.g., a mechanism for PID control with respect to proportional and integral.

FIG. 20(b) shows a constitution of the PID control, wherein Kp represents a proportional gain, Ti represents an integral time, Td represents a derivative time, and s represents a Laplace operator.

The control mechanism 2 further includes filters, such as a low-pass filter, a band-pass filter, and a notch filter, and is capable of performing setting of filter parameters, such as the order and frequency of the filters.

The signal sent from the control mechanism 2 is inputted into an object to be processed. The object to be processed is each of axes of the stage.

An actual signal is set to a motor for driving the stage. Into a judging mechanism, data may be measured (detected) by a detecting mechanism, such as not only these for position measurement, but also, a load exerted on the mold or the substrate.

Further, into a control mechanism 3, a z-correction signal is inputted from the profiler. This is effective in the case wherein a signal is intended to be added under a condition other than that for the control mechanism 2. The control mechanism 3 is constituted by a proportional gain and a filter. The judging mechanism provides an instruction to change a control parameter or a drive profile for the substrate mechanisms 2 and 3.

With reference to FIG. 20(c), a state of imprinting control will be described. In this embodiment, a profile of the z-position is not changed, but a control parameter and a z-correction profile are changed. The time chart includes the z-position profile, the z-correction profile, a change with time of a load exerted on the mold, and a modified example of the derivative time Td on the basis of the load data.

In the area (1), the load is not changed, since the mold and the resin material do not contact each other.

In the area (2), the mold and the resin material contact each other, but the load is merely changed to a negligible degree. In order to suppress the disturbance occurring before and after the contact, the derivative time Td is increased at a boundary between the areas (1) and (2).

In the area (3), the load exerted on the mold is increased with a decreasing distance between the mold and the resin material. In this area, the load is steadily changed, so that the derivative time Td is set from a boundary between the areas (2) and (3). Further, in the case of increasing the deviation, the target value is corrected.

In the area (4), the resin material is diffused, and the load is decreased after a target value of the substrate becomes constant. Also, in the area, the derivative time. Td is set.

In the area (5), a substantially steady state is established. Also, in this area, the derivative time Td is set.

In the area (6), UV irradiation is performed. Before and/or after the UV irradiation, the disturbance occurs, so that the derivative time Td is set at a boundary between the areas (5) and (6).

In the area (7), the release between the mold and the substrate is started, but the mold and the resin material are separated from each other. In this area, the load is steadily changed, so that the derivative time Td is set.

In the area (8), the mold and the substrate are separated from each other. In this case, the load is not changed, so that the derivative time Td is constant.

Incidentally, the control conditions for the boundaries between the areas (2) and (3) and between the areas (4) and (5), such as the control parameter, the drive profile, and the control method, can be roughly estimated by performing imprint for determining the conditions.

In the embodiments described with reference to FIG. 13 to FIG. 20(c), the members and means for the imprinting method and the imprinting apparatus of the present invention include the exposure light source 301, the mold holding portion 302, the substrate holding portion 303, the substrate lifting mechanism 304, the in-plane moving mechanism 305, the optical system 306, and load cell 307, the interferometer 308, the analyzing mechanism 309, the imprint control mechanism 310, the mold 311, the substrate 312, and the photocurable resin material 313.

INDUSTRIAL APPLICABILITY

As described above, according to the present invention, it is possible to effect alignment control suitable for the imprinting process.

While the invention has been described with reference to the structures disclosed herein, it is not confined to the details set forth and this application is intended to cover such modifications or changes as may come within the purpose of the improvements or the scope of the following claims.

The invention claimed is:

1. An imprinting method in which alignment control of a mold and a substrate is effected with respect to an in-plane direction of the substrate and a pattern formed on the mold is transferred onto a pattern forming layer provided on the substrate, said imprinting method comprising:
    a step of bringing the mold and the substrate near to each other while effecting the alignment control, based on a driving profile, after the alignment control is started, to bring the mold and the pattern forming layer into contact with each other, and then the pattern forming layer is cured; and
    a step of increasing a gap between the mold and the substrate, after the pattern forming layer is cured,
    wherein the driving profile for the alignment control after contact of the mold and the pattern forming layer is different from the driving profile for the alignment control before the contact of the mold and the pattern forming layer,
wherein the driving profile for the alignment control is a profile for moving at least one of the mold and the substrate to a target position, and
wherein the driving profile for the alignment control includes at least one of an acceleration, a speed, a driving voltage, and a driving current.

2. A process for producing a member, the process comprising:
a step of transferring a pattern formed on a mold onto a pattern forming layer provided on a substrate by using an imprinting method according to claim 1; and
a step of etching the substrate through, as a mask, the pattern forming layer on which the pattern is transferred in said step of transferring the pattern.

3. A method according to claim 1, further comprising a detecting step of detecting at least one of a load exerted on the mold or the substrate, a gap between the mold and the substrate, a displacement of the mold or the substrate, a torque of a stage, and an amount of reflected light from the mold or the substrate,
wherein the driving profile for the alignment control is changed on the basis of a detected value in said detecting step.

4. A method according to claim 3, wherein the driving profile for the alignment control is changed on the basis of a change in differential coefficient of the detected value and a change in second order differential coefficient of the detected value.

5. A method according to claim 1, wherein the driving profile for the alignment control is changed in the alignment control on the basis of a load exerted between the mold and the substrate.

6. A method according to claim 1, wherein the driving profile for the alignment control is changed in the alignment control after the mold contacts the pattern forming layer and before the pattern forming layer is cured.

7. A method according to claim 1, wherein the driving profile is changed before the mold contacts the pattern forming layer, and
wherein the driving profile after the contact of the mold and the pattern forming layer is different from the driving profile before the driving profile is changed.

8. An imprinting method in which alignment control of a mold and a substrate is effected with respect to an in-plane direction of the substrate and a pattern formed on the mold is transferred onto a pattern forming layer provided on the substrate, said imprinting method comprising:
a step of contacting the mold and the pattern forming layer to each other by bringing the mold and the substrate near to each other while effecting the alignment control based on a driving profile;
a step of bringing the mold, contacting the pattern forming layer, and the substrate further near to each other;
a step of curing the pattern forming layer in a state in which the mold and the substrate are brought further near to each other; and
a step of increasing a gap between the mold and the substrate, after the pattern forming layer is cured,
wherein the driving profile for the alignment control after the contact of the mold and the pattern forming layer is different from the driving profile for the alignment control before the contact of the mold and the pattern forming layer,
wherein the driving profile for the alignment control is a profile for moving at least one of the mold and the substrate to a target position, and
wherein the driving profile for the alignment control includes at least one of an acceleration, a speed, a driving voltage, and a driving current.

9. A process for producing a member, the process comprising:
a step of transferring a pattern formed on a mold onto a pattern forming layer provided on a substrate by using an imprinting method according to claim 8; and
a step of etching the substrate through, as a mask, the pattern forming layer on which the pattern is transferred in said step of transferring the pattern.

10. A method according to claim 8, wherein the driving profile is changed after the mold contacts the pattern forming layer and before the pattern forming layer is cured.

11. A method according to claim 8,
wherein the driving profile is changed before the mold contacts the pattern forming layer, and
wherein the driving profile after the contact of the mold and the pattern forming layer is different from the driving profile before the driving profile is changed.

12. An imprinting method in which alignment control of a mold and a substrate is effected with respect to an in-plane direction of the substrate and a pattern formed on the mold is transferred onto a pattern forming layer provided on the substrate, said imprinting method comprising:
a step of bringing the mold and the substrate near to each other while effecting the alignment control, based on a control parameter, after the alignment control is started, to bring the mold and the pattern forming layer into contact with each other, and then the pattern forming layer is cured; and
a step of increasing a gap between the mold and the substrate, after the pattern forming layer is cured,
wherein a control parameter for the alignment control after the contact of the mold and the pattern forming layer is different from the control parameter for the alignment control before the contact of the mold and the pattern forming layer,
wherein the control parameter for the alignment control is a parameter for moving at least one of the mold and the substrate to a target position, and
wherein the control parameter for the alignment control includes at least one of a PID parameter, a feedforward parameter, and a filter parameter.

13. A method according to claim 12, wherein the control parameter is changed after the mold contacts the pattern forming layer and before the pattern forming layer is cured.

14. A method according to claim 12, wherein the control parameter is changed before the mold contacts the pattern forming layer, and
wherein the control parameter after the contact of the mold and the pattern forming layer is different from the control parameter before the control parameter is changed.

15. An imprinting method in which alignment control of a mold and a substrate is effected with respect to an in-plane direction of the substrate and a pattern formed on the mold is transferred onto a pattern forming layer provided on the substrate, said imprinting method comprising:
a step of contacting the mold and the pattern forming layer to each other by bringing the mold and the substrate near to each other while effecting the alignment control based on a control parameter;

a step of bringing the mold, contacting the pattern forming layer, and the substrate further near to each other;

a step of curing the pattern forming layer in a state in which the mold and the substrate are brought further near to each other; and a step of increasing a gap between the mold and the substrate, after the pattern forming layer is cured, wherein the control parameter for the alignment control after the contact of the mold and the pattern forming layer is different from the control parameter for the alignment control before the contact of the mold and the pattern forming layer, wherein the control parameter for the alignment control is a parameter for moving at least one of the mold and the substrate to a target position, and wherein the control parameter for the alignment control includes at least one of a PID parameter, a feedforward parameter, and a filter parameter.

16. A method according to claim 15, wherein the control parameter is changed after the mold contacts the pattern forming layer and before the pattern forming layer is cured.

17. A method according to claim 15, wherein the control parameter is changed before the mold contacts the pattern forming layer, and wherein the control parameter after the contact of the mold and the pattern forming layer is different from the control parameter before the control parameter is changed.

18. An imprinting method in which alignment control of a mold and a substrate is effected with respect to an in-plane direction of the substrate and a pattern formed on the mold is transferred onto a pattern forming layer provided on the substrate, said imprinting method comprising:

a step of bringing the mold and the substrate near to each other while effecting the alignment control, based on a control parameter, after alignment control is started, to bring the mold and the pattern forming layer into contact with each other, and then the pattern forming layer is cured; and a step of increasing a gap between the mold and the substrate, after the pattern forming layer is cured, wherein the control parameter for the alignment control after the contact of the mold and the pattern forming layer is different from the control parameter for the alignment control before the contact of the mold and the pattern forming layer, wherein the control parameter for the alignment control is a parameter for moving at least one of the mold and the substrate to a target position, and wherein the control parameter for the alignment control is a proportional gain.

19. A method according to claim 18, wherein the proportional gain is changed after the mold contacts the pattern forming layer and before the pattern forming layer is cured.

20. A method according to claim 18, wherein the proportional gain is changed before the mold contacts the pattern forming layer, and wherein the proportional gain after the contact of the mold and the pattern forming layer is different from the proportional gain before the proportional gain is changed.

21. An imprinting method in which alignment control of a mold and a substrate is effected with respect to an in-plane direction of the substrate and a pattern formed on the mold is transferred onto a pattern forming layer provided on the substrate, said imprinting method comprising:

a step of contacting the mold and the pattern forming layer to each other by bringing the mold and the substrate near to each other while effecting the alignment control based on a control parameter;

a step of bringing the mold, contacting the pattern forming layer, and the substrate further near to each other;

a step of curing the pattern forming layer in a state in which the mold and the substrate are brought further near to each other; and a step of increasing a gap between the mold and the substrate, after the pattern forming layer is cured, wherein the control parameter for the alignment control after the contact of the mold and the pattern forming layer is different from the control parameter for the alignment control before the contact of the mold and the pattern forming layer, wherein the control parameter for the alignment control is a parameter for moving at least one of the mold and the substrate to a target position, and wherein the control parameter for the alignment control is a proportional gain.

22. A method according to claim 21, wherein the proportional gain is changed after the mold contacts the pattern forming layer and before the pattern forming layer is cured.

23. A method according to claim 21, wherein the proportional gain is changed before the mold contacts the pattern forming layer, and wherein the proportional gain after the contact of the mold and the pattern forming layer is different from the proportional gain before the control parameter is changed.

24. An imprinting method in which alignment control of a mold and a substrate is effected with respect to an in-plane direction of the substrate and a pattern formed on the mold is transferred onto a pattern forming layer provided on the substrate, said imprinting method comprising:

a step of curing the pattern forming layer after contacting the mold and the pattern forming layer to each other by bringing the mold and the substrate near to each other while effecting the alignment control, based on a driving profile, after a start of the alignment control;

a step of increasing a gap between the mold and the substrate after the pattern forming layer is cured; and a step of changing the driving profile for the alignment control after the alignment control is started and at least one of before and after the contact of the mold and the pattern forming layer, wherein the driving profile for the alignment control is a profile for moving at least one of a mold holding portion for holding the mold and a substrate holding portion for holding the substrate to a target position, and wherein the driving profile for the alignment control includes at least one of an acceleration, a speed, a driving voltage, and a driving current with respect to at least one of the mold holding portion and the substrate holding portion.

25. An imprinting method in which alignment control of a mold and a substrate is effected with respect to an in-plane direction of the substrate and a pattern formed on the mold is transferred onto a pattern forming layer provided on the substrate, said imprinting method comprising:

a step of contacting the mold and the pattern forming layer to each other by bringing the mold and the substrate near to each other while the effecting alignment control based on a driving profile;

a step of bringing the mold, contacting the pattern forming layer, and the substrate further near to each other;

a step of curing the pattern forming layer in a state in which the mold and the substrate are brought further near to each other;

a step of increasing a gap between the mold and the substrate after the pattern forming layer is cured; and a step of changing the driving profile for the alignment control, in steps from said step of contacting the mold and the pattern forming layer to said step of bringing the mold, contacting the pattern forming layer, and the substrate further near to each other, at least one of before and after the contact of the mold and the pattern forming layer, wherein the driving profile for the alignment control is a profile for moving at least one of a mold holding portion for holding the mold and a substrate holding portion for holding the substrate to a target position, and wherein the driving profile for the alignment control includes at least one of an acceleration, a speed, a driving voltage, and a driving current with respect to at least one of the mold holding portion and the substrate holding portion.

26. An imprinting method in which alignment control of a mold and a substrate is effected with respect to an in-plane direction of the substrate and a pattern formed on the mold is transferred onto a pattern forming layer provided on the substrate, said imprinting method comprising:

a step of curing the pattern forming layer after contacting the mold and the pattern forming layer to each other by bringing the mold and the substrate near to each other while effecting the alignment control, based on a control parameter, after a start of the alignment control;

a step of increasing a gap between the mold and the substrate after the pattern forming layer is cured; and a step of changing a control parameter for the alignment control after the alignment control is started and at least one of before and after the contact of the mold and the pattern forming layer, wherein the control parameter for the alignment control is a parameter used in control for moving at least one of a mold holding portion for holding the mold and a substrate holding portion for holding the substrate to a target position, and wherein the control parameter for the alignment control includes at least one of a PID parameter, a feedforward parameter, and a filter parameter.

27. An imprinting method in which alignment control of a mold and a substrate is effected with respect to an in-plane direction of the substrate and a pattern formed on the mold is transferred onto a pattern forming layer provided on the substrate, said imprinting method comprising:

a step of curing the pattern forming layer after contacting the mold and the pattern forming layer to each other by bringing the mold and the substrate near to each other while effecting the alignment control, based on a control parameter, after a start of the alignment control;

a step of increasing a gap between the mold and the substrate after the pattern forming layer is cured; and a step of changing the control parameter for the alignment control after the alignment control is started and at least one of before and after the contact of the mold and the pattern forming layer, wherein the control parameter for the alignment control is a parameter used in control for moving at least one of a mold holding portion for holding the mold and a substrate holding portion for holding the substrate to a target position, and wherein the control parameter for the alignment control includes a proportional gain.

* * * * *